United States Patent
Kawashima

(10) Patent No.: US 11,978,772 B2
(45) Date of Patent: May 7, 2024

(54) METHOD OF MANUFACTURING SEMICONDUCTOR DEVICE

(71) Applicant: RENESAS ELECTRONICS CORPORATION, Tokyo (JP)

(72) Inventor: Yoshiyuki Kawashima, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 256 days.

(21) Appl. No.: 17/678,460

(22) Filed: Feb. 23, 2022

(65) Prior Publication Data

US 2023/0268400 A1    Aug. 24, 2023

(51) Int. Cl.
*H01L 21/28* (2006.01)
*H01L 29/423* (2006.01)
*H01L 29/66* (2006.01)
*H01L 29/78* (2006.01)
*H01L 29/792* (2006.01)

(52) U.S. Cl.
CPC .. *H01L 29/40117* (2019.08); *H01L 29/42344* (2013.01); *H01L 29/66484* (2013.01); *H01L 29/66833* (2013.01); *H01L 29/7832* (2013.01); *H01L 29/792* (2013.01)

(58) Field of Classification Search
CPC ......... H01L 29/40117; H01L 29/42344; H01L 29/66484; H01L 29/66833; H01L 29/7832; H01L 29/792; H01L 29/4234
See application file for complete search history.

(56) References Cited

U.S. PATENT DOCUMENTS 7,872,298 B2    1/2011   Shimamoto et al.
2013/0082315 A1*  4/2013  Hosoda ............ H01L 29/42364
                                                257/315

FOREIGN PATENT DOCUMENTS

JP    2008-041832 A    2/2008

* cited by examiner

*Primary Examiner* — Mohammad M Choudhry
(74) *Attorney, Agent, or Firm* — Rimon P.C.

(57) ABSTRACT

A first gate electrode is formed on a semiconductor substrate via a first insulating film containing a metal element. A sidewall insulating film is formed on a side surface of the first gate electrode. A second gate electrode is formed on the semiconductor substrate via a second insulating film. The second gate electrode is formed so as to adjacent to the first gate electrode via the second insulating film. The second insulating film is made of a stacked film having a third insulating film, a fourth insulating film having a charge accumulating function, and a fifth insulating film. The third insulating film is formed on the semiconductor substrate as a result of an oxidation of a portion of the semiconductor substrate, and formed on the side surface of the first gate electrode as a result of an oxidation of the sidewall insulating film, by the thermal oxidation treatment.

18 Claims, 14 Drawing Sheets

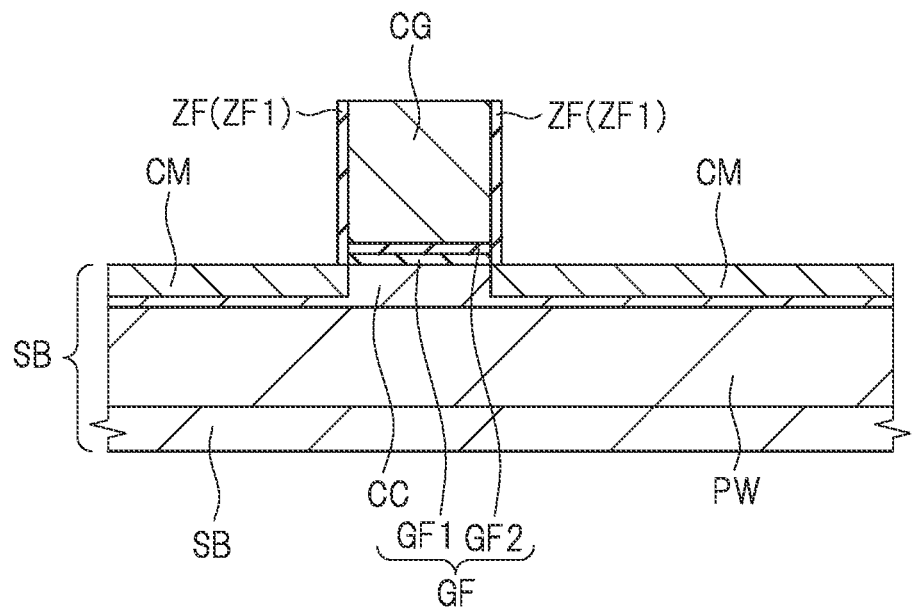
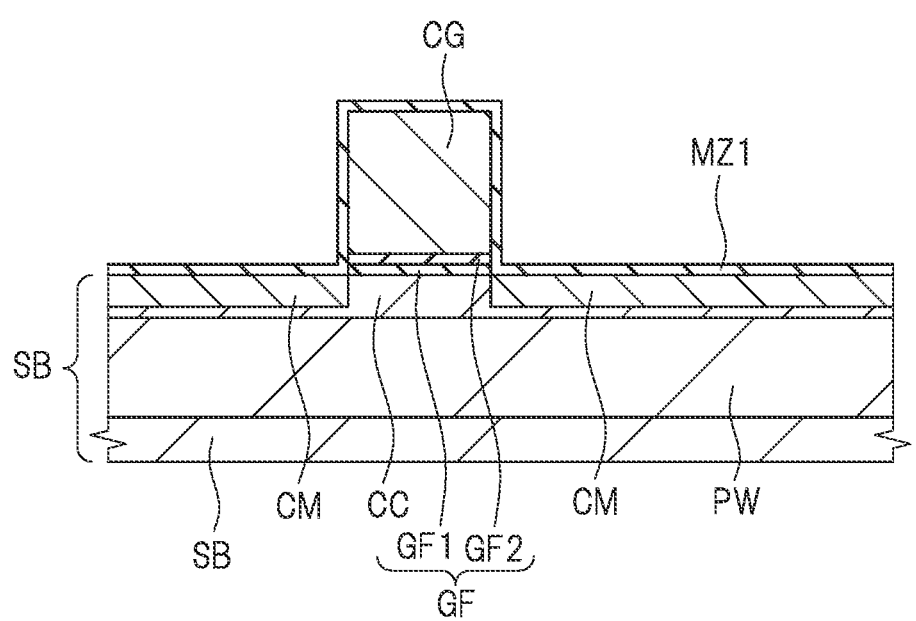

METHOD OF MANUFACTURING SEMICONDUCTOR DEVICE

BACKGROUND

EEPROM (Electrically Erasable and Programmable Read Only Memory) has been widely used as a non-volatile semiconductor storage device capable of electrically writing and erasing. These storage devices, represented by the flash memory that has been currently widely used, have a conductive floating gate electrode or a trapping insulating film surrounded by an oxide film below a gate electrode of a MISFET, and the charge accumulation state in the floating gate or the trapping insulating film is used as storage information, and the charge accumulation state is read as a threshold value of the transistor. The trapping insulating film refers to an insulating film capable of accumulating electric charges, and as an example, it is a silicon nitride film or the like. By injecting and releasing charges into such charge storage regions, the threshold of MISFET (Metal Insulator Semiconductor Field Effect Transistor) is shifted so that the MISFET is operated as a storage device. When a trapped insulating film such as a silicon nitride film is used as a charge storage region, as compared with the case where a conductive floating gate film is used as a charge storage region, it has advantages such as having an excellent reliability of data retention in order to accumulate charge discretely, and thinning of the oxide film on the top and bottom of the silicon nitride film in order to be excellent in reliability of data retention, and reducing a voltage of the write and erase operations are possible.

Japanese Unexamined Patent Application Publication No. 2008-41832 discloses a technique relating to a semiconductor device having a non-volatile memory.

There are disclosed techniques listed below.
[Patent Document 1] Japanese Unexamined Patent. Application Publication No. 2008-41832

SUMMARY

Regarding a semiconductor device having a memory element, it is desired to improve its performance.

Other problems and novel features will become apparent from the description herein and from the accompanying drawings.

According to an embodiment, a method of manufacturing a semiconductor device, including: (a) preparing a semiconductor substrate; (b) forming a first gate electrode for a memory element of a non-volatile memory on the semiconductor substrate via a first insulating film containing a metal element; (c) after the (b) forming a sidewall insulating film on a side surface of the first gate electrode; and (d) after the (c), forming a second gate electrode for the memory element on the semiconductor substrate via a second insulating film. Here, in the (d), the second gate electrode is formed so as to be adjacent to the first gate electrode via the second insulating film. The second insulating film is made of a stacked film having a third insulating film and the fourth insulating film and the fifth insulating film, the fourth insulating film has a charge accumulating function. The (d) includes: (d1) forming the third insulating film by thermal oxidation treatment; (d2) forming the fourth insulating film on the third insulating film; and (d3) forming the fifth insulating film on the fourth insulating film. In the (d1), the third insulating film located between the second gate electrode and the semiconductor substrate is formed as a result of an oxidation of a portion of the semiconductor substrate by the thermal oxidation treatment, and the third insulating film located between the second gate electrode and the first gate electrode is formed as a result of an oxidation on the sideway insulating film by the thermal oxidation treatment.

According to another embodiment, a method of manufacturing a semiconductor device, comprising: (a) preparing a semiconductor substrate; (b) forming a first gate electrode for a memory element of the non-volatile memory on the semiconductor substrate via a first insulating film containing a metal element; (c) after the (b), forming a sidewall insulating film on the side surface of the first gate electrode, and (d) after the (c), a second gate electrode for the memory element is formed on the semiconductor substrate via a second insulating film. Here, in the (d), the second gate electrode is formed so as to be adjacent to the first gate electrode via the second insulating film. The second insulating film is made of a stacked film having a third insulating film and the fourth insulating film and the fifth insulating film, the fourth insulating film has a charge accumulating function. The (d) includes: (d1) forming a third insulating film by thermal oxidation treatment; (d2) forming the fourth insulating film on the third insulating film; and (d3) forming the fifth insulating film on the fourth insulating film. In the (d1), the third insulating film located between the second gate electrode and the semiconductor substrate is formed as a result of an oxidation of a portion of the semiconductor substrate by the thermal oxidation treatment, and the third insulating film located between the second gate electrode and the first gate electrode is formed as a result of an oxidation of a portion of the sidewall insulating film by the thermal oxidation treatment.

BRIEF DESCRIPTIONS OF THE DRAWINGS

FIG. 7 is a cross-sectional view of a main part during the manufacturing process of the semiconductor device following FIG. 6.

FIG. 8 is a cross-sectional view of a main part during the manufacturing process of the semiconductor device following FIG. 7.

Figure 17:
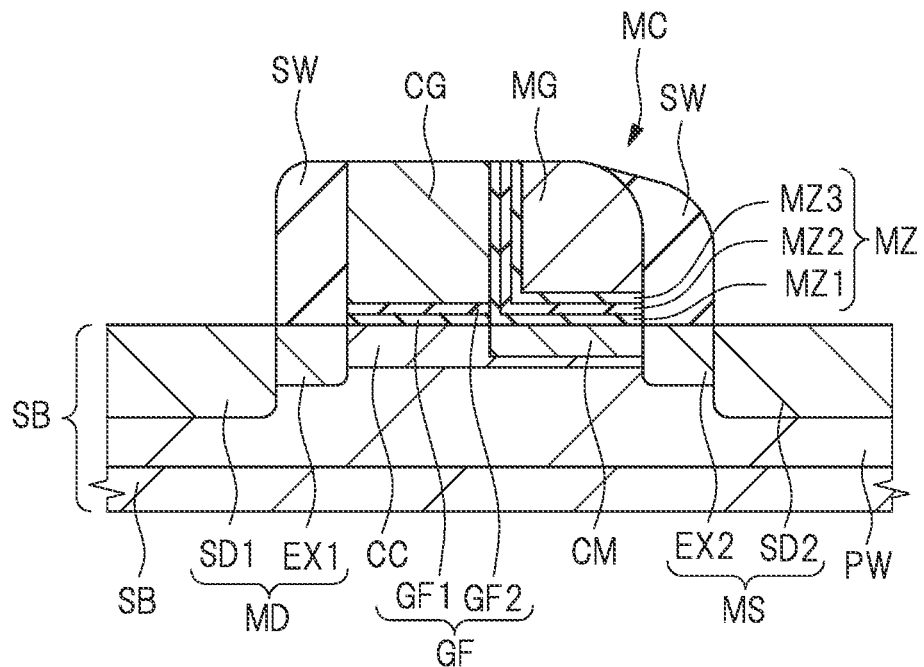
FIG. 17 is a cross-sectional view of a main part during the manufacturing process of the semiconductor device following FIG. 16.
Figure 18:
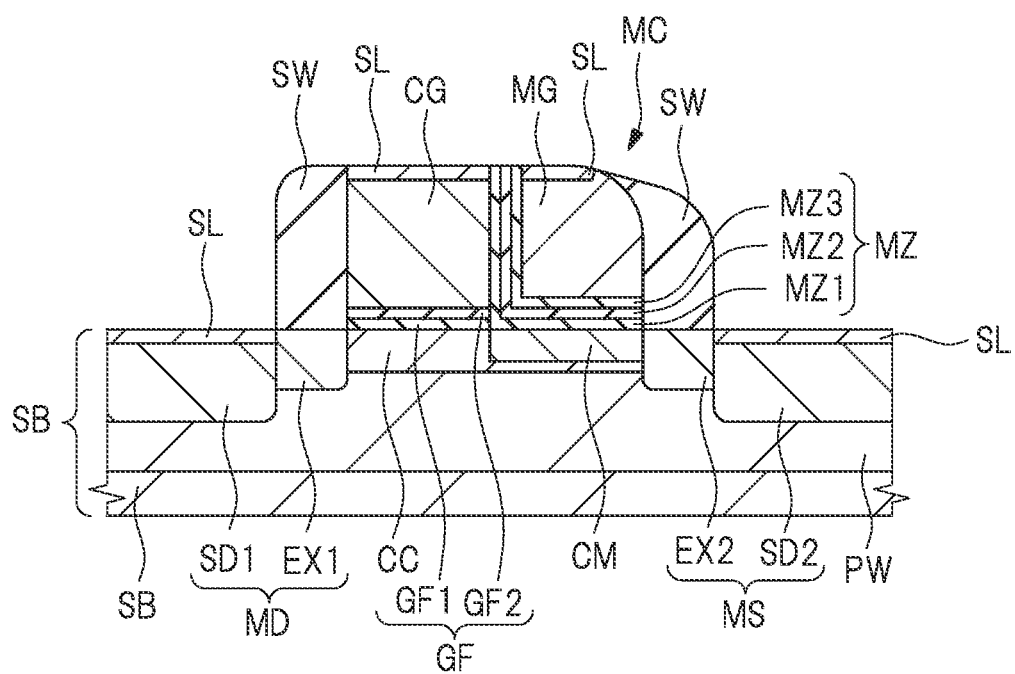

FIG. 18 . . . s a cross-sectional view of a main part during the manufacturing process of the semiconductor device following FIG. 17.

Figure 19:
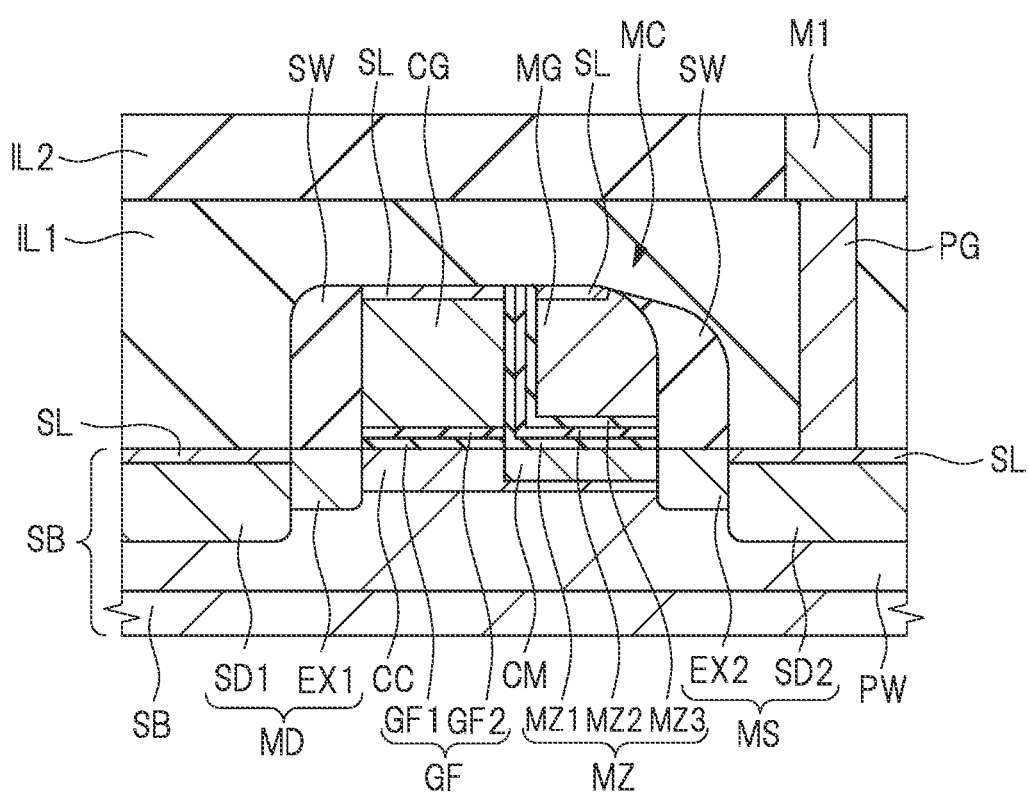

FIG. 19 is a cross-sectional view of a main part during the manufacturing process of the semiconductor device following FIG. 18.

Figure 20:
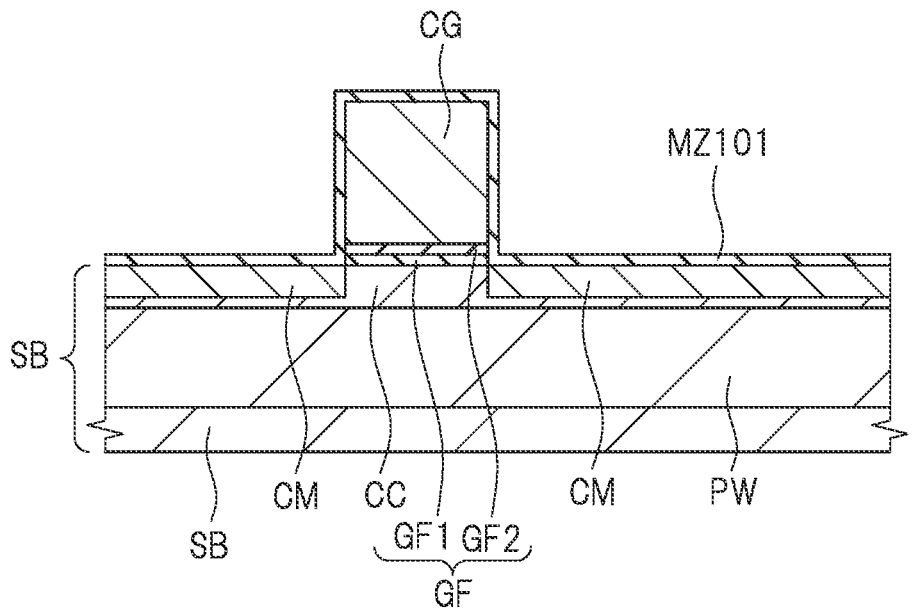

FIG. 20 is a cross-sectional view of a main part during the manufacturing process of the semiconductor device of the study example.

Figure 21:
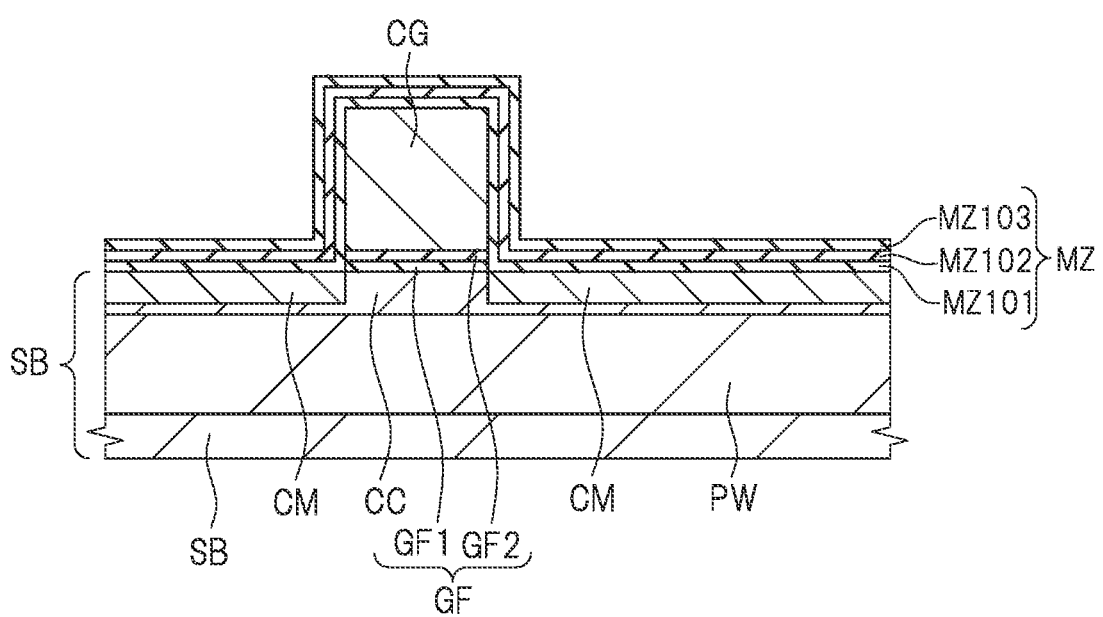

FIG. 21 is a cross-sectional view of a main part during the manufacturing process of the semiconductor device following FIG. 20.

Figure 22:
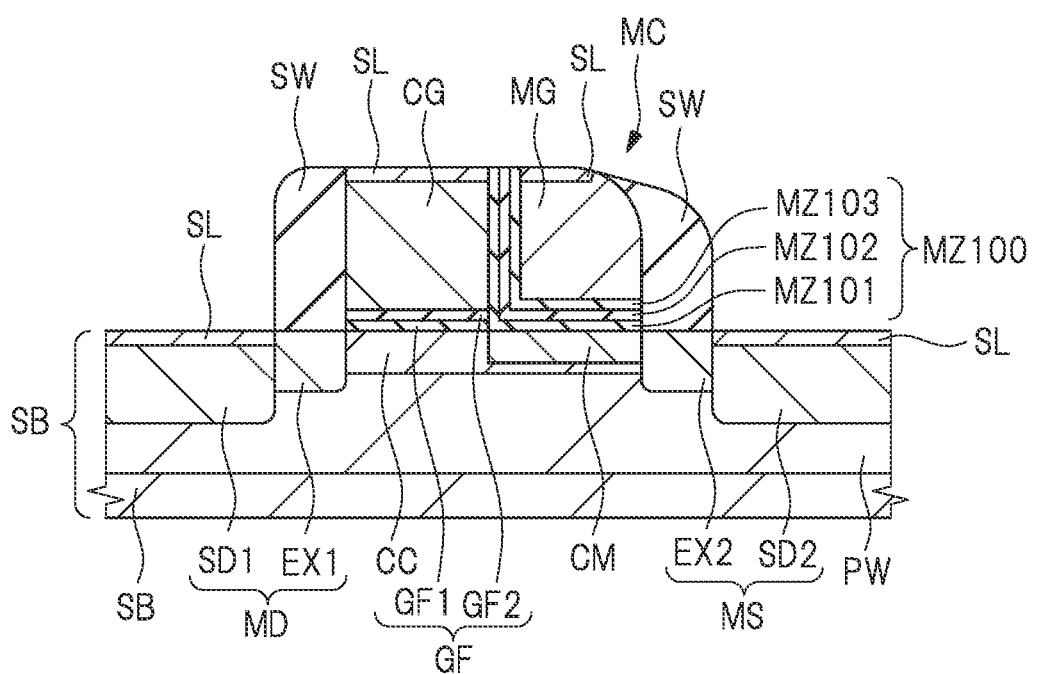

FIG. 22 is a cross-sectional view of a main part during the manufacturing process of the semiconductor device following FIG. 21.

Figure 23:
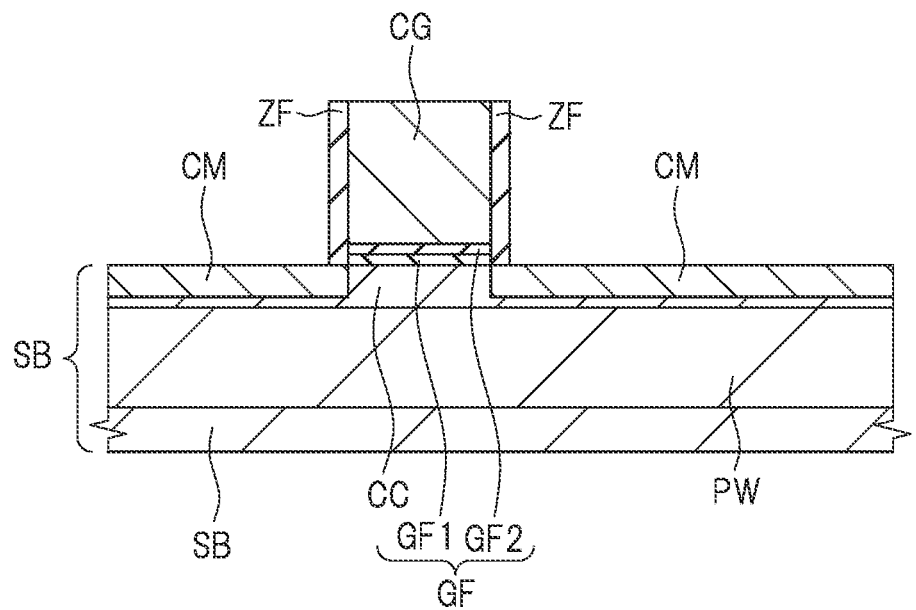

FIG. 23 is a cross-sectional view of a main part during the manufacturing process of the semiconductor device of another embodiment.

Figure 24:
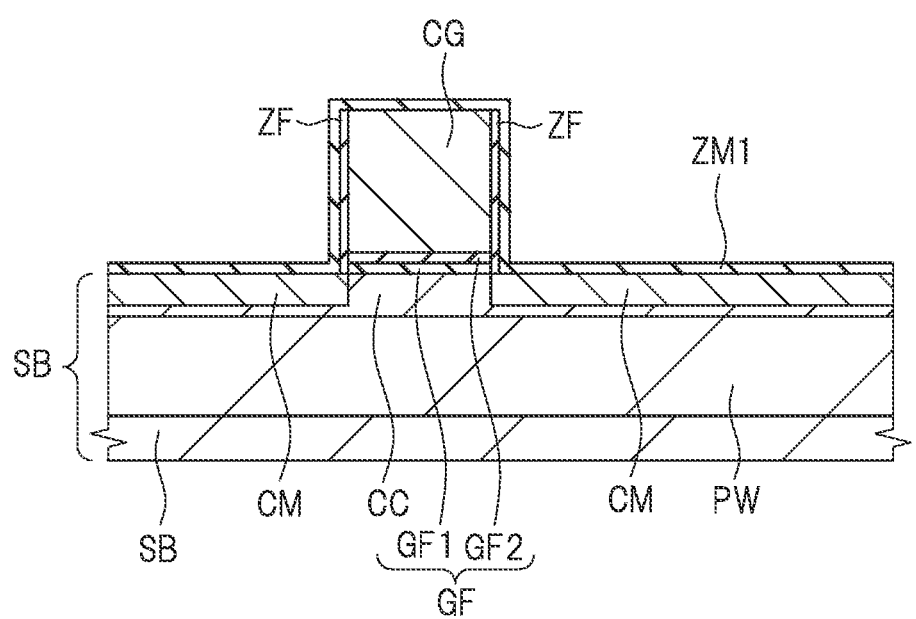

FIG. 24 is a cross-sectional view of a main part during the manufacturing process of the semiconductor device following FIG. 23.

Figure 25:
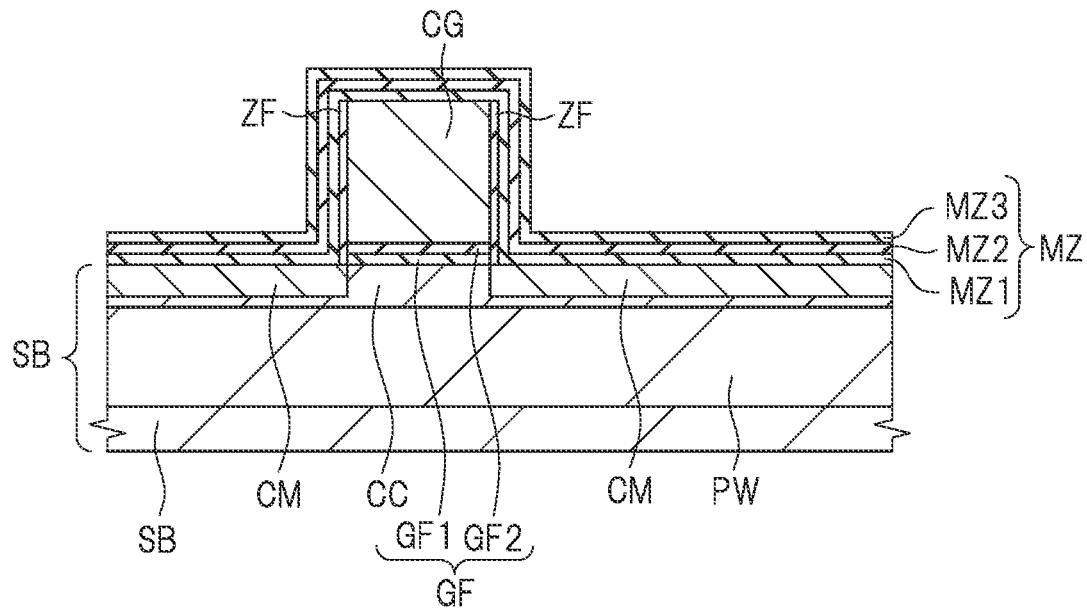

FIG. 25 is a cross-sectional view of a main part during the manufacturing process of the semiconductor device following FIG. 24.

Figure 26:
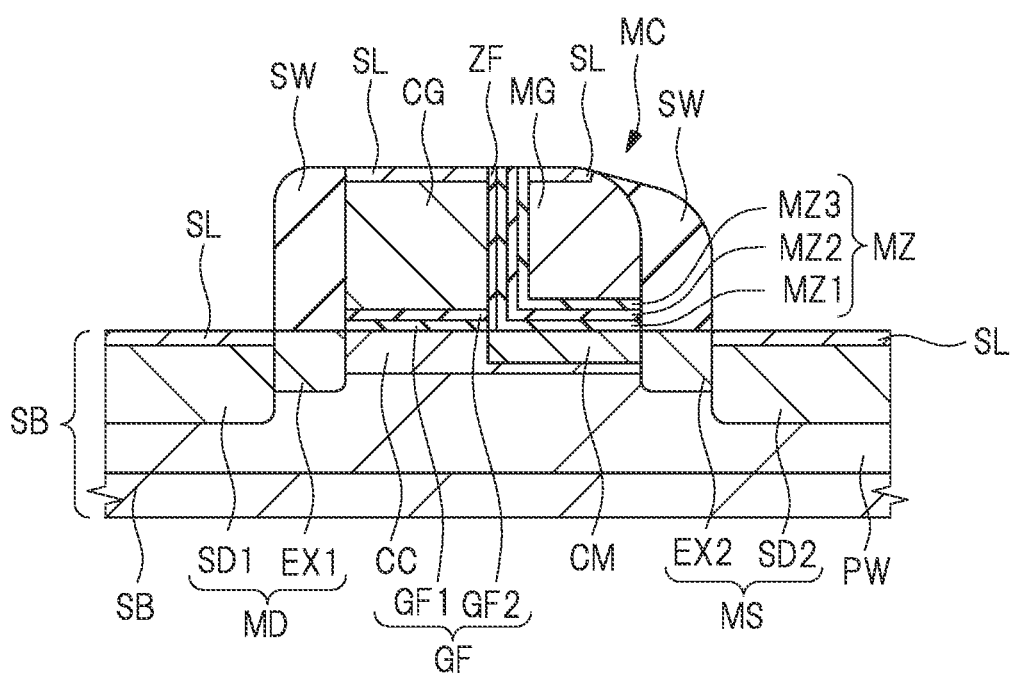

FIG. 26 is a cross-sectional view of a main part during the manufacturing process of the semiconductor device following FIG. 25.

DETAILED DESCRIPTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Also, components having the same function are denoted by the same reference symbols throughout the drawings for describing the embodiments, and the repetitive description thereof is omitted.

In addition, the description of the same or similar portions is not repeated in principle unless particularly required in the following embodiments.

Also, in some drawings used in the embodiments, hatching is used even in a plan view so as to make the drawings easy to see.

First Embodiment

<About a Manufacturing Process of a Semiconductor Device>

A manufacturing process of the semiconductor device of this embodiment will be described with reference to FIGS. 1 to 19. FIGS. 1 to 19 are cross-sectional views of a main part during the manufacturing process of the semiconductor device according to the present embodiment.

The semiconductor device of the present embodiment is a semiconductor device having a non-volatile memory. In FIGS. 1 to 19, a cross-sectional view of a main part of a memory-element forming region is shown which is an area in which a memory element (memory cell) MC constituting a non-volatile memory is formed. In FIGS. 1 to 19, a cross-section perpendicular to an extending direction of a memory gate electrode MG and a control gate electrode CG constituting the memory element MC is shown. Therefore, the direction perpendicular to the paper surface of FIGS. 1 to 19 is a gate-width direction of the memory gate electrode MG and the control gate electrode CG. In practice, to a semiconductor substrate SB, a plurality of memory elements MC are formed in an array.

Figure 1:
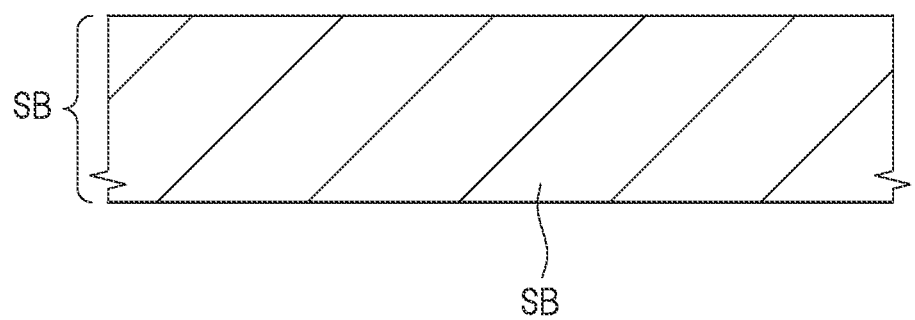
FIG. 1 is a cross-sectional view of a main part during the manufacturing process of the semiconductor device of an embodiment.

To manufacture the semiconductor device of the present embodiment, as shown in FIG. 1, first, a semiconductor substrate (semiconductor wafer) SE made of, for example, p-type single crystal silicon having a specific resistance of about 1 to 10 Ωcm is prepared. Then, into a main surface of the semiconductor substrate SB, an element-isolation region defining an active region (not shown) is formed using a STI (Shallow Trench Isolation) method or the like.

Figure 2:
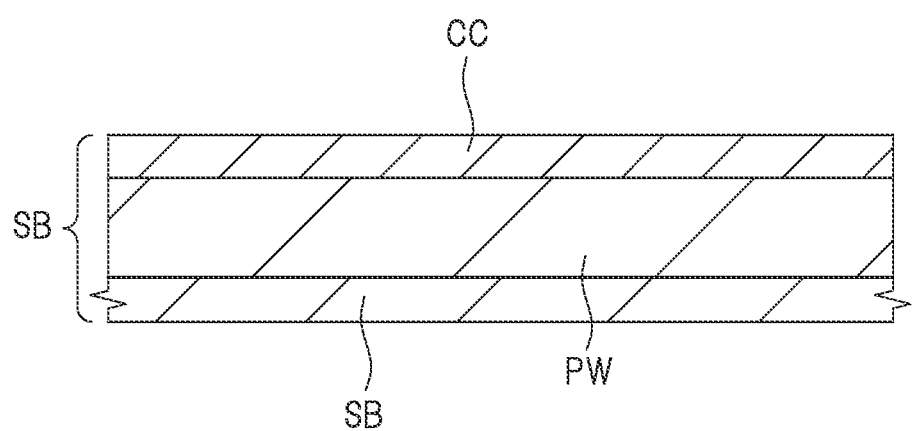
FIG. 2 is a cross-sectional view of a main part during the manufacturing process of the semiconductor device following FIG. 1.

Next, as shown in FIG. 2, a p-type well PW is formed on the semiconductor substrate SB of the memory-element forming region using an ion implantation method or the like. P-type well PW is formed over a predetermined depth from the main surface of the semiconductor substrate SE.

Next, by introducing a p-type impurity into a surface (upper) layer portion of the p-type well PW by an ion implantation method or the like, semiconductor region CC for the channel region of the control transistor is formed using an ion implantation method or the like. Since this ion implantation is performed to adjust a threshold voltage of the control transistor, it can be regarded as channel-doped ion implantation for the control transistor. The semiconductor region CC is formed to include a channel forming region of the control transistor. Semiconductor region CC is a p-type semiconductor region.

Figure 3:
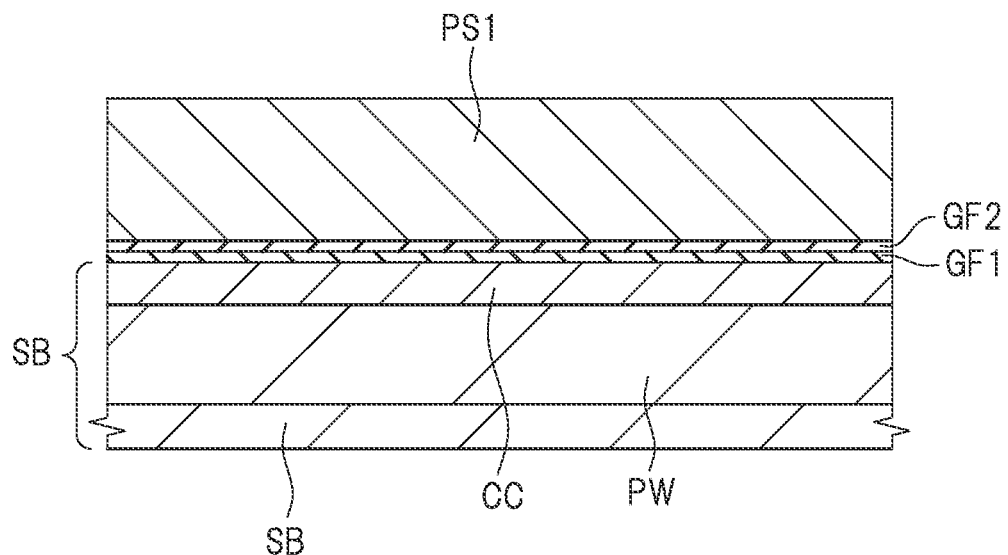
FIG. 3 is a cross-sectional view of a main part during the manufacturing process of the semiconductor device following FIG. 2.

Next, after cleaning the surface of the semiconductor substrate SB by dilute hydrofluoric acid cleaning or the like (the surface of the semiconductor region CC in FIG. 2), as shown in FIG. 3, an insulating film GF1 is formed to the main surface of the semiconductor substrate SE. The insulating film GF1 is formed of a silicon oxide film, and it can be preferably formed by thermal oxidation. As the insulating film GF1, it is also possible to form a silicon oxynitride film in place of the silicon oxide film. At this stage, the insulating film GF1 does not contain metallic elements.

Next, on the insulating film GF1, an insulating film GF2 is formed. The insulating film GF2 contains a metal (metal element). Therefore, the insulating film GF2 can also be regarded as a metallic-element-containing film. The insulating film GF2 containing a metallic element is used to adjust a threshold voltage of the control transistor, specifically, to increase an absolute value of the threshold voltage of the control transistor.

As the metallic element insulating film GF2 contains, hafnium (Hf), aluminum (Al) or zirconium (Zr) is preferred. Further, it is preferable that the insulating; film GF2 further contains oxygen (O). The insulating film GF2 may further contain silicon (Si) in addition to the metallic element and oxygen. Therefore, the insulating film GF2 is preferably a metal oxide film or a metal silicate film. Accordingly, as the insulating film GF2, a hafnium oxide film, a hafnium silicate film, an aluminum oxide film, an aluminum silicate film, a zirconium oxide film or a zirconium silicate film is suitable. The insulating film GF2 can be formed using, for example, a CVD (Chemical Vapor Deposition) method or an ALD (Atomic Layer Deposition) method. As the insulating film GF2 containing a metallic element has a higher dielectric constant than silicon oxide, it can also be regarded as a high dielectric constant film (high-k film). An areal density of the metallic element in the insulating film GF2, for example, may be about $1\times10^{12}$~$2\times10^{15}$ atoms/cm2. Further, after the deposition of the insulating film GF2, such as by heat treatment in a plasma nitriding treatment or ammonia atmosphere, it is also possible to introduce nitrogen into the insulating film GF2.

Next, on the main surface of the semiconductor substrate SB, i.e., on the insulating film GF2, as a conductive film for forming the control gate electrode, a silicon film PS1 is formed. The silicon film PS1 is formed of polycrystalline silicon film, and it can be formed by using a CVD method or the like. Further, it is also possible to form the silicon film PS1 as an amorphous silicon film during film formation, then the amorphous silicon film is transformed to a polycrystalline silicon film by a subsequent heat treatment. When an n-type or p-type impurity is introduced into the silicon film PS1, an n-type or p-type impurity can be introduced at the time of film formation on the silicon film PS1 or after film formation.

Figure 4:
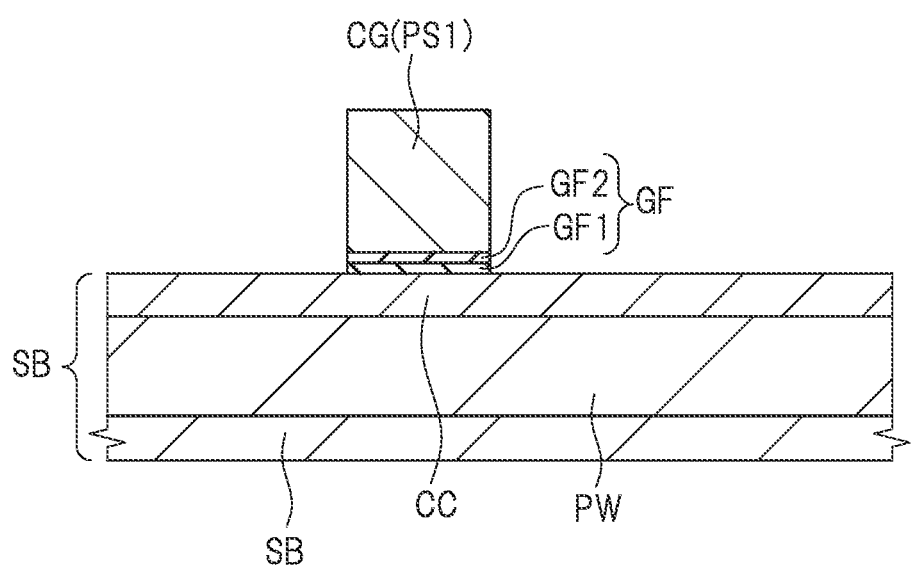
FIG. 4 is a cross-sectional view of a main part during the manufacturing process of the semiconductor device following FIG. 3.

Next, as shown in FIG. 4, the silicon film PS1 is patterned using photolithography and etching techniques to form a control gate electrode CG formed of the patterned silicon film PS1. The control gate electrode CG functions as a gate electrode of the control transistor. In the memory-element forming region, the insulating films GF2, GF1 other than the portion covered with the control gate electrode CG may be removed by dry etching performed in the patterning step of the silicon film PS1 or by performing wet etching after the dry etching. The insulating films GF2, GF1 below the control gate electrode CG remain without being etched to be a gate insulating film GF for the control transistor. In this manner, the control gate electrode CG is in a state of being formed on the semiconductor substrate SS (semiconductor region CC), via the gate insulating film GF formed of the insulating film GF1 and the insulating film GF2 The gate insulating film SF is formed of a stacked film having the insulating film GF2 formed on the insulating film GF1 and die insulating film GF1. Since the insulating film GF2 contains a metal element, the gate insulating film GF can also be regarded as a film containing a metal element.

Figure 5:
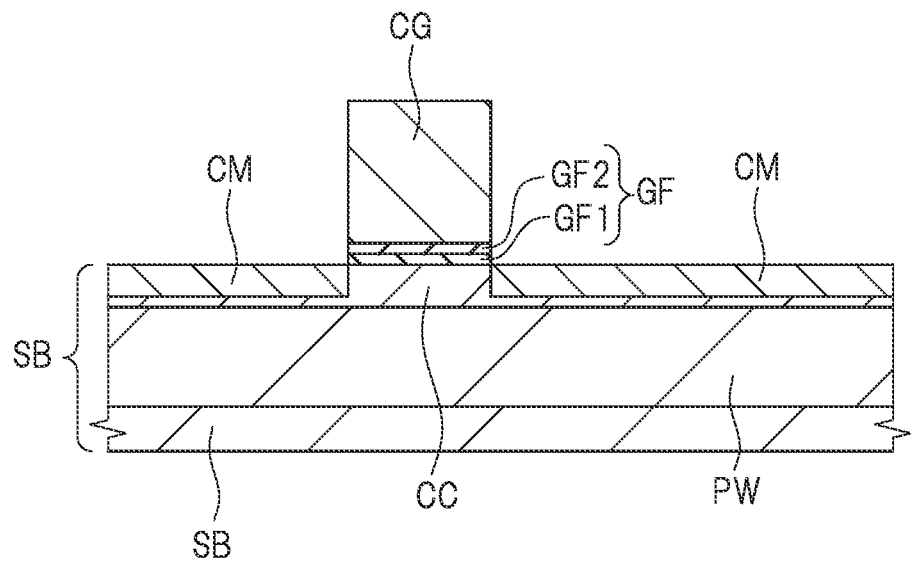
FIG. 5 is a cross-sectional view of a main part during the manufacturing process of the semiconductor device following FIG. 4.

Next, as shown in FIG. 5, using the control gate electrode CG as a mask (ion implantation blocking mask), by introducing n-type impurities into the surface layer portion of the semiconductor substrate SE by the ion implantation method, to form a semiconductor region CM for the channel region of the memory transistor. Since this ion implantation is performed to adjust the threshold voltage of the memory transistor, it can be regarded as channel-doped ion implantation for memory transistors. The semiconductor region CM is formed include a channel forming region of the memory transistor.

The semiconductor region CM is a p-type or n-type semiconductor region in which the effective impurity concentration of the semiconductor region CM can be adjusted by the dose of ion implantation upon forming the semiconductor region CC and the dose of ion implantation upon forming the semiconductor region CM. When the semiconductor region CM is p-type, the effective p-type impurity concentration of the semiconductor region CM (charge density of impurities) is lower than the effective p-type impurity concentration of the semiconductor region CC (charge density of impurities). Further, when the semiconductor region CM is n-t the effective n-type impurity concentration of the semiconductor region CM (charge density of impurities) is lower than the effective n-type impurity concentration of an n--type semiconductor region EX2 to be formed later (charge density of impurities). The semiconductor region CM is, in the surface layer portion of the semiconductor substrate SB, formed on both sides of the control gate electrode CG. Therefore, in the semiconductor substrate SB of the memory-element forming region, under the control gate electrode CG, the semiconductor region CM is not formed but the semiconductor region CC is formed, whereas the semiconductor region CM is formed in the region not covered with the control gate electrode CG.

Figure 6:
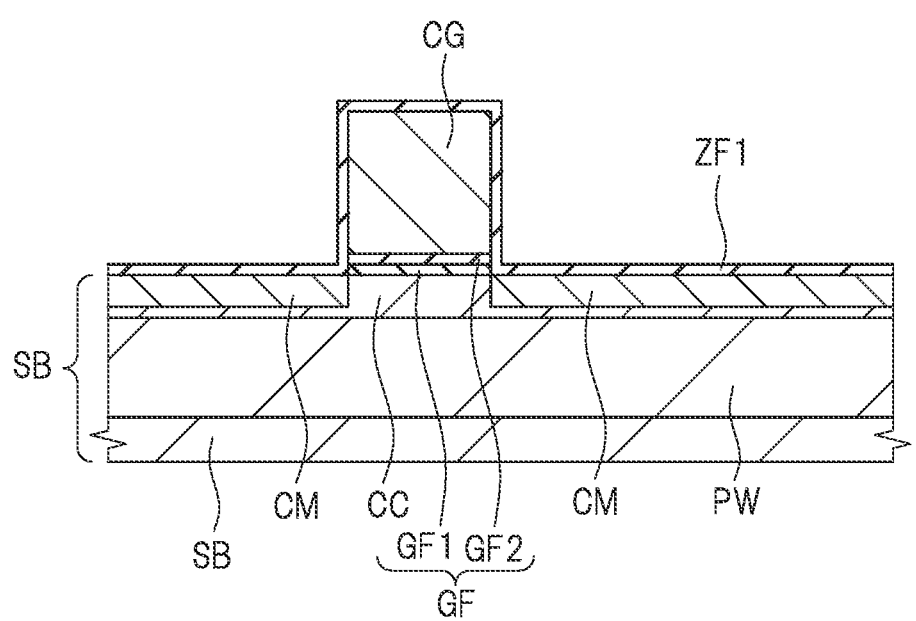
FIG. 6 is a cross-sectional view of a main part during the manufacturing process of the semiconductor device following FIG. 5.

Next, as shown in FIG. 6, an insulating film ZF1 is formed on the main surface of the semiconductor substrate SB so as to cover the control gate electrode CG. The insulating film ZF1 is preferably formed of a silicon nitride film, and it can be formed using a CVD method or the like. In the memory-element forming region, the insulating film ZF1 is formed on the upper surface of the control gate electrode CG, on the side surface (side wall) of the control gate electrode CG, and on the semiconductor substrate SB (semiconductor region CM) of a portion not covered with the control gate electrode CG.

The insulating film ZF1 is then etched back by an anisotropic etching technique, as shown in FIG. 7. This etch-back process leaves an insulating film ZF1 on both sides (sidewalls) of the control gate electrode CG and removes the other portion of insulating film ZF1. Thus, as shown in FIG. 7, on both sides of the control gate electrode CG, the sidewall insulating film ZF formed of the remaining insulating film ZF1 is formed. The insulating film ZF1 on the upper surface of the control gate electrode CG and the insulating film ZF1 on the semiconductor substrate SB (semiconductor area CM) of the part not covered with the control gate electrode CG are removed in the etch-back process. A sidewall insulating film ZF is formed so as to cover the side surface of the control gate electrode CG and the side surface of the gate insulating film GF under the control gate electrode CG (end surface). The thickness of the sidewall insulating film ZF may be, for example, about 2 to 5 cm.

Next, by performing a thermal oxidation treatment, as shown in FIG. 8, an insulating film MZ1 is formed. The insulating film MZ1 is an oxide film formed by thermal oxidation (silicon oxide film) fand formed on the semiconductor substrate SB of a portion not covered by the control gate electrode CG (semiconductor region CM), on the side surface of the control gate electrode CG (sidewall) and on the upper surface of the control gate electrode CG. That is, by an oxidation of die semiconductor substrate SB, the insulating film MZ1 is formed on the semiconductor substrate SB. By an oxidation of the sidewall insulating film ZF, the insulating film MZ1 is formed on the side surface of the control gate electrode CG. By an oxidation of the control gate electrode CG, the upper surface of the control gate electrode CG insulating film MZ1 is formed. Therefore, in the memory-element forming region, the insulating film MZ1 is formed on the main surface of the semiconductor substrate SB so as to cover the control gate electrode CG.

As the thermal oxidation treatment for forming the insulating film MZ1, it is preferable to use ISSG (In Situ Steam Generation) oxidation. Here, ISSG oxidation is a way of oxidation by generating oxygen radicals (active oxygen) by reacting hydrogen molecules (H2) and oxygen molecules (O2) in a vicinity of the surface of the heated semiconductor substrate, and using the oxygen radicals.

Among the insulating films MZ1, the insulating film MZ1 formed on the semiconductor substrate SB of a portion not covered with the control gate electrode CG is an oxide film (silicon oxide film) formed as a result an oxidation of the surface of the semiconductor substrate SB. Further, the insulating film MZ1 formed on the upper surface of the control gate electrode CG is an oxide film (silicon oxide film) that is formed as a result of an oxidation of the surface (upper surface) of the silicon film constituting the control gate electrode CG. Further, the insulating film MZ1 formed on the side surface of the control gate electrode CG (sidewall) is an oxide film (silicon oxide film) formed as a result of an oxidation of the sidewall insulating film ZF. That is, the sidewall insulating film ZF which has been formed on the side surface of the control gate electrode CG is transformed to an insulating film MZ1 as the entire of the sidewall insulating film ZF is oxidized by thermal oxidation treatment (preferably ISSG oxidation treatment). Therefore, although the sidewall insulating film ZF made of silicon nitride is formed on both sides of the control gate electrode CG prior to performing the thermal oxidation process for forming the insulating film MZ1, when performing the thermal oxidation process for forming the insulating film MZ1, on both sides of the control gate electrode CG, the insulating film MZ1 made of silicon oxide becomes a state of being formed, and the side surface of the control gate electrode CG is in contact with the insulating film MZ1. Since the oxidizing power of ISSG oxide is strong, the sidewall insulating film ZF made of silicon nitride is accurately oxidized, it is possible to change the insulating film MZ1 made of silicon oxide. A thickness of the insulating film MZ1 on the semiconductor-substrate SB may be, for example, about 2 to 5 nm.

Figure 9:
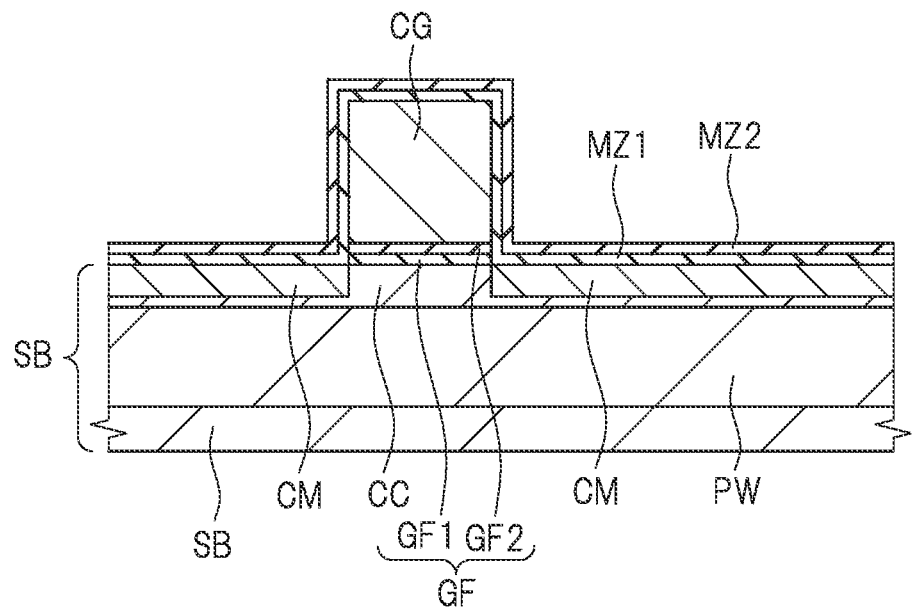
FIG. 9 is a cross-sectional view of a main part during the manufacturing process of the semiconductor device following FIG. 8.

Next, as shown in FIG. 9, an insulating film MZ2 on the insulating film MZ1 is formed. The insulating film MZ2 is an insulating film capable of functioning as a charge accumulating portion (charge accumulating layer), preferably made of a silicon nitride film. The insulating film MZ2 can be formed using, for example OVID method or ALL method. The thickness of the insulating film MZ2 may be, for example, about 5 to 15 nm.

Figure 10:
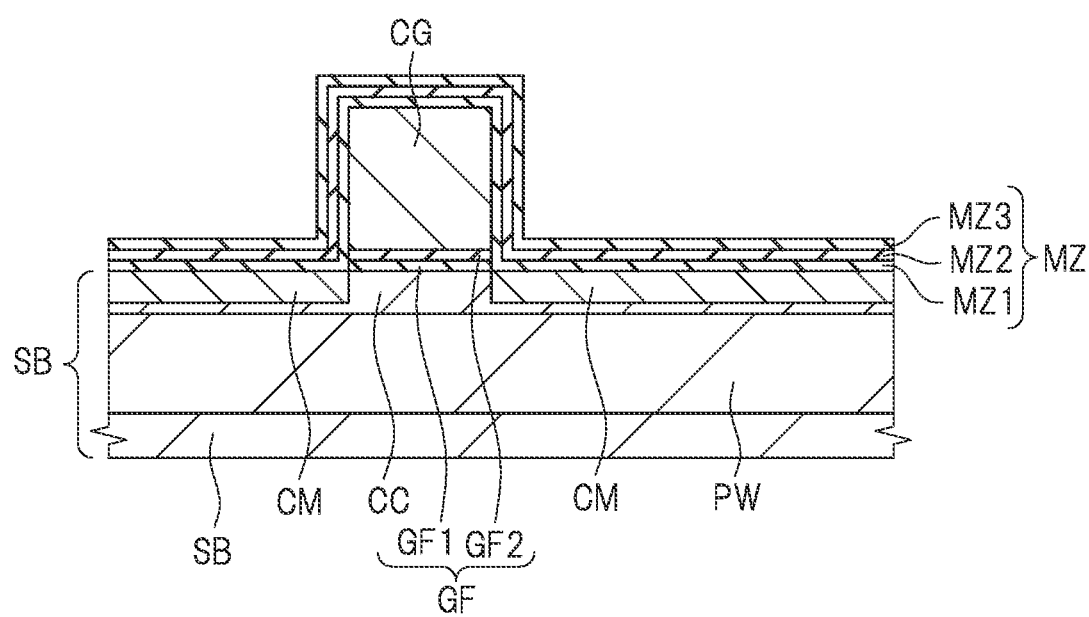
FIG. 10 is a cross-sectional view of a main part during the manufacturing process of the semiconductor device following FIG. 9.

Next, as shown in FIG. 10, an insulating film MZ3 on the insulating film MZ2 is formed. The insulating film MZ3 is preferably made of a silicon oxide film. The insulating film MZ3 can be formed using, for example, a CVD method or ALD method. The thickness of the insulating film MZ3 may be, for example, about 3 to 7 nm.

In this manner, an insulating film (laminated insulating film) MZ having the insulating film MZ1, the insulating film MZ2 on the insulating film MZ1, the insulating film MZ3 on the insulating film MZ2 is formed. The insulating film MZ is formed on the semiconductor substrate SB of a portion not covered by the control gate electrode CG (semiconductor region CM), on the side surface of the control gate electrode CG (specifically the side surface of the laminate of the gate insulating film GF and the control gate electrode CG), and on the upper surface of the control gate electrode CG. Therefore, in the memory-element forming region, the insulating film MZ is formed on the main surface of the semiconductor substrate SB so as to cover the control gate electrode CG.

Figure 11:
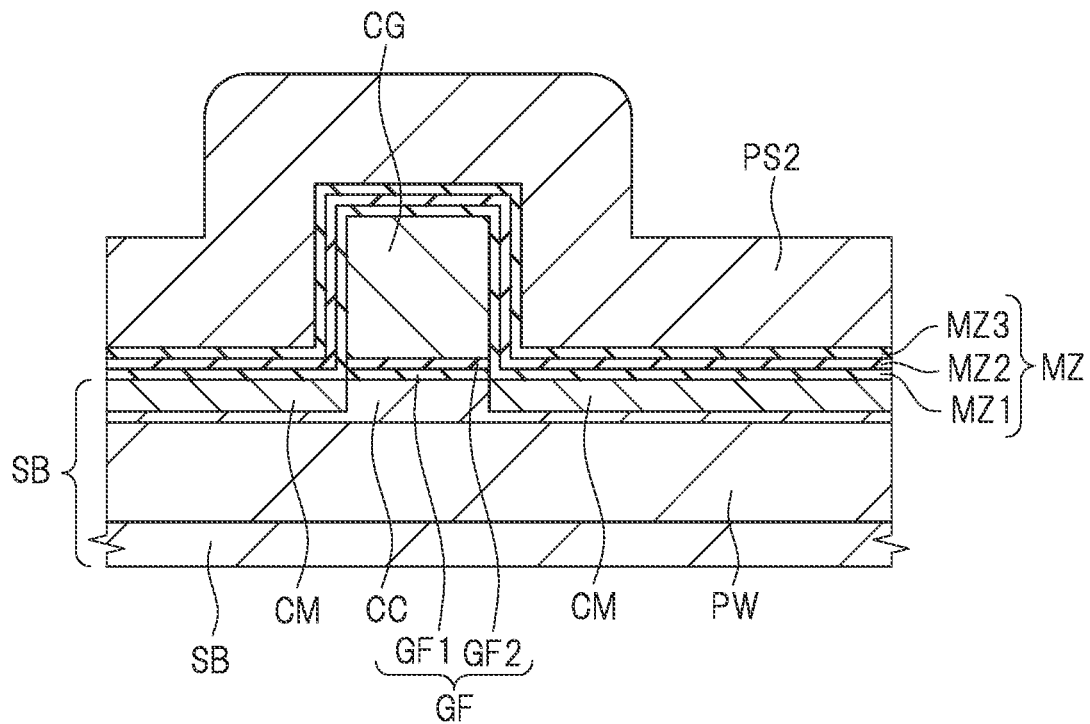
FIG. 11 is a cross-sectional view of a main part during the manufacturing process of the semiconductor device following FIG. 10.

Next, as shown in FIG. 11, on the entire main surface of the semiconductor substrate SE, i.e., on the insulating film MZ, a silicon film PS2 is formed so as to cover the control gate electrode CG and as a conductive film for forming a memory gate electrode. The silicon film PS2 is formed of a polycrystalline silicon film, it can be formed by using a CVD method or the like. At the time of film formation, the silicon film PS2 is formed as an amorphous silicon film, and then it is also possible to change the amorphous silicon film to a polycrystalline silicon film by subsequent heat treatment. When an n-type or p-type impurity is introduced into the silicon film PS2, an n-type or p-type impurity can be introduced at the time of film formation on the silicon film PS2 or after film formation.

Figure 12:
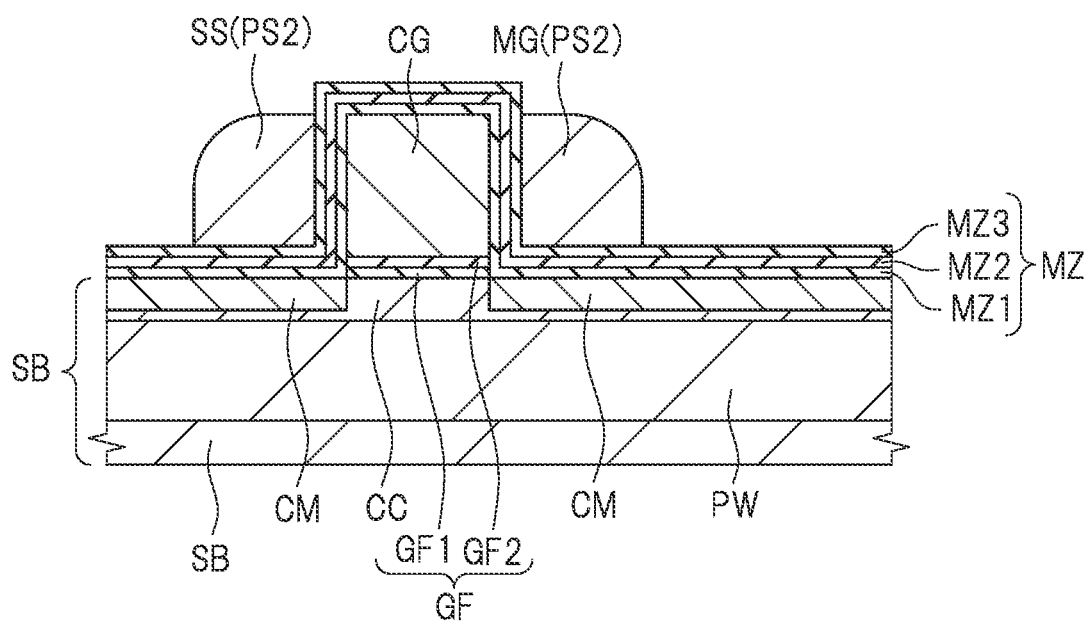
FIG. 12 is a cross-sectional view of a main part during the manufacturing process of the semiconductor device following FIG. 11.

The silicon film PS2 is then etched back by an anisotropic etching technique. In this etch-back step, by anisotropically etching the silicon film PS2 by the amount of the deposited film thickness of the silicon film PS2, on both sides of the control gate electrode CG, the silicon film PS2 in a sidewall spacer shape is left via the insulating film MZ, and the silicon film PS2 of the other regions is removed. Thus, as shown in FIG. 12, of both sides of the control gate electrode CG, the memory gate electrode MG is formed of the silicon film PS2 remaining in the sidewall spacer shape via the insulating film MZ on one side surface. Further, among the sides of both the control gate electrode CG, a silicon spacer SS is formed of the silicon film PS2 remaining in the sidewall spacer shape via the insulating film MZ on the other side surface. The memory gate electrode MG is formed on the insulating film MZ so as to be adjacent to the control gate electrode CG via the insulating film MZ. The insulating film MZ in the area not covered by the memory gate electrode MG and the silicon spacer SS is exposed.

Figure 13:
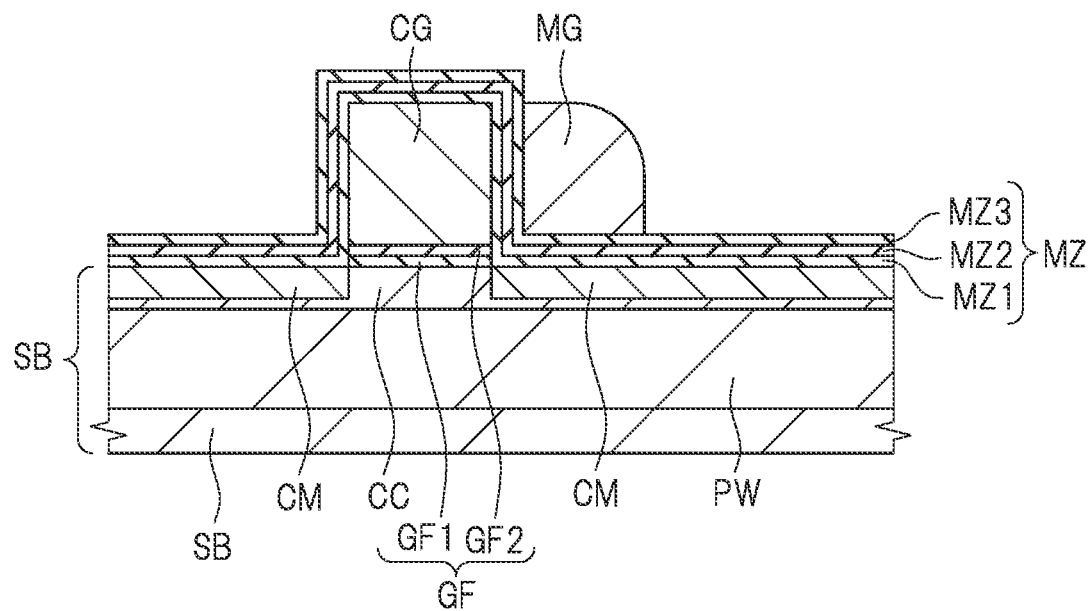
FIG. 13 is a cross-sectional view of a main part during the manufacturing process of the semiconductor device following FIG. 12.

Next, as shown in FIG. 13, a photolithography technique and an etching technique are used to remove the silicon spacer SS, leaving the control gate electrode CG without etching.

Figure 14:
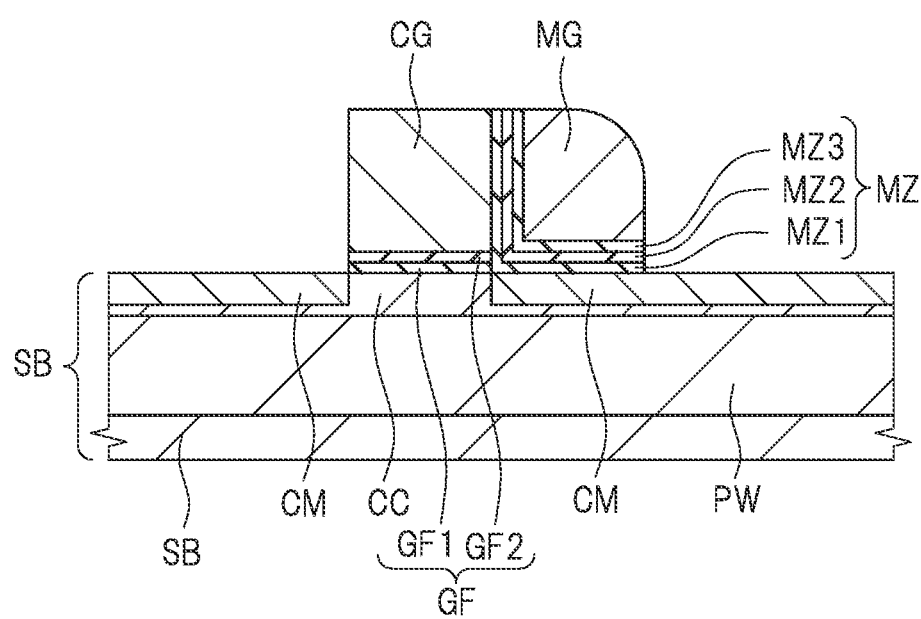
FIG. 14 is a cross-sectional view of a main part during the manufacturing process of the semiconductor device following FIG. 13.

Next, as shown in FIG. 14, among the insulating film MZ, the portion exposed without being covered by the memory gate electrode MG is removed by etching (e.g., wet etching). At this time, the insulating film MZ located between the lower memory gate electrode MG and the memory gate electrode MG and the control gate electrode CG of the memory gate electrode MG remains without being removed, and the insulating films MZ of the other regions are removed. The insulating film MZ is continuously extending over both regions of a region between the memory gate electrode MG and the semiconductor substrate SB, a region between the memory gate electrode MG and the control gate electrode CG, the insulating film MZ under the memory gate electrode MG functions as a gate insulating film of the memory transistor.

Figure 15:
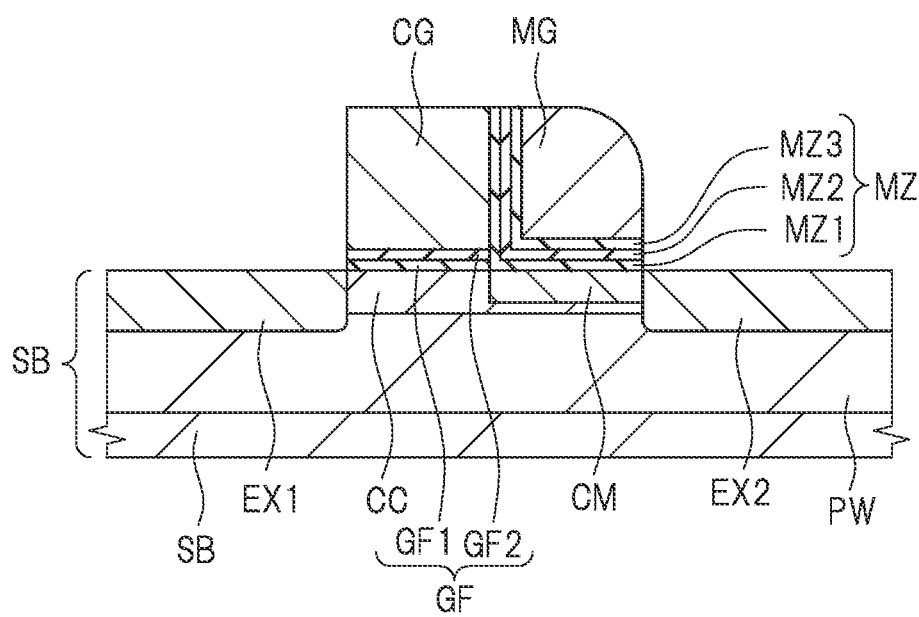
FIG. 15 is a cross-sectional view of a main part during the manufacturing process of the semiconductor device following FIG. 14.

Next, by introducing the n-type impurities into the semiconductor substrate SB (p-type well PW) using the control gate electrode CG and the memory gate electrode MG as a mask (ion implantation blocking mask) n--type semiconductor regions EX1, EX2 are formed using an ion implantation method or the like as shown in FIG. 15. The n-type semiconductor regions EX1, EX2, in the semiconductor substrate SB (PW), are respectively formed on both sides of the structure having the control gate electrode CG and the memory gate electrode MG. Incidentally, the n--type semiconductor region EX1 is formed to be self-aligned with the side surface of the control gate electrode CG, and the n--type semiconductor region EX2 is formed to be self-aligned with the side surface of the memory gate electrode MG.

Figure 16:
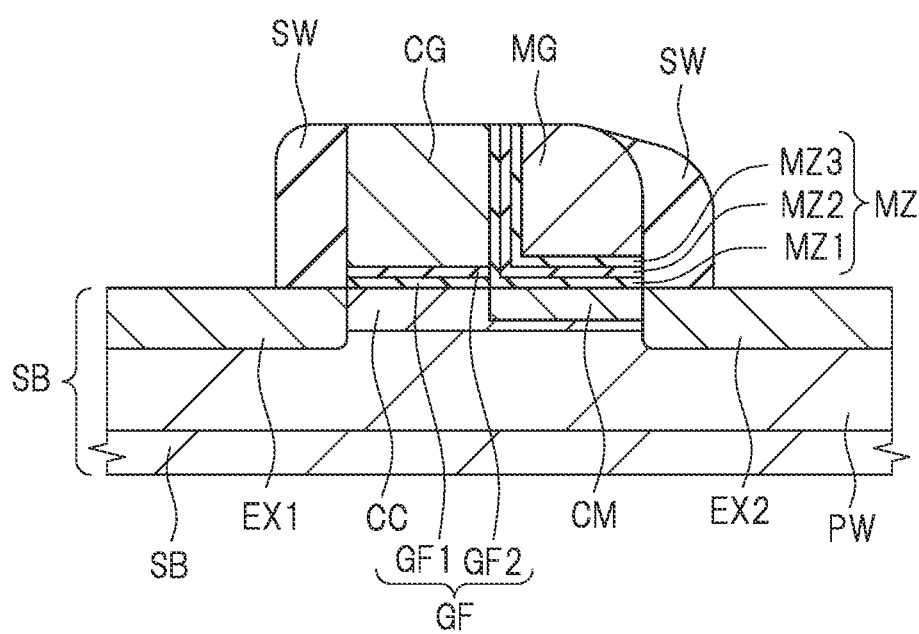
FIG. 16 is a cross-sectional view of a main part during the manufacturing process of the semiconductor device following FIG. 15.

Next, on the main surface of the semiconductor substrate SB, so as to cover the control gate electrode CG and the memory gate electrode MG, after forming an insulating film (e.g., silicon oxide film), a sidewall spacer SW is formed by etching back the insulating film as shown in FIG. 16. The sidewall spacer SW is formed on the other side surfaces (sidewalls) of the side surfaces facing each other via the insulating film MZ of the control gate electrode CG and the memory gate electrode MG.

Next, as shown in FIG. 17, through an ion implantation method or the like, by introducing an n-type impurity to the semiconductor substrate SE (p-type well PW) using the control gate electrode CG and the memory gate electrode MG and the sidewall spacer SW on their side surfaces as a mask (ion implantation blocking mask), n+-type semiconductor regions SD1, SD2 are formed. The n+-type semiconductor regions SD1, SD2, in the semiconductor substrate SE, are respectively formed on both sides of the control gate electrode CG, the structure consisting of the memory gate electrode MG and the sidewall spacer SW. Incidentally, the n+-type semiconductor region SD1 is formed to be self-aligned with the side surface of the sidewall spacer SW formed on the side surface of the control gate electrode CG, and the n+-type semiconductor region SD2 is formed to be self-aligned with the side surface of the sidewall spacer SW formed on the side surface of the memory gate electrode MG. An n-type impurity concentration of the n+-type semiconductor regions SD1, SD2 is higher than an n-type impurity concentration of the n--type semiconductor regions EX1, EX2.

Next, an activation annealing, which is heat treatment for activating impurities introduced so far, is performed.

In this manner, the memory element MC of the non-volatile memory is formed.

The salicide (Salicide, Self-aligned silicide) technique is then used to form the metallic silicide layer SL, as shown in FIG. 18. A metal silicide layer SE, can be formed on each upper portion of the n+-type semiconductor areas SD1, SD2, the control gate electrode CG and the memory gate electrode MG.

Next, as shown in FIG. 19, on the entire main surface of the semiconductor substrate SB, an insulating film IL1 is formed as an interlayer insulating film so as to cover the control gate electrode CG, the memory gate electrode MG and the sidewall spacer SW. After forming the insulating film IL1, the upper surface of the insulating film IL1 is planarized using a CMP (Chemical Mechanical Polishing: chemical mechanical polishing) method or the like as required. Then, a contact hole is formed in the insulating film IL1, then a conductive plug PG is formed in the contact hole. The plug PG is electronically connected to n+-type solid state area SD1, n+-type solid state area SD2, the control gate element CG, the memory gate element MG or the like. Then, after forming an insulating film IL2 on the insulating film IL1 in which the plug PG is embedded, and then forming a wiring groove in the insulating film IL2, a wiring M1 is formed in the wiring groove using a single damascene technique. Thereafter, to form a second layer and subsequent wirings by a dual damascene method or the like, illustration and description thereof will be omitted here.

As described above, the semiconductor device of the present embodiment is manufactured.

<Structure of the Semiconductor Device>

Next, a structure of the semiconductor device of the present embodiment will be described with reference to FIG. 19.

As shown in FIG. 19, to the semiconductor substrate SB, the memory element (memory cell) MC that is a non-volatile memory consisting of a memory transistor and a control transistor is formed. In practice, to the semiconductor substrate SE, a plurality of memory elements MC is formed in an array.

As shown in FIG. 19, the memory element MC that is a non-volatile memory is a split-gate memory element, in which two MISFETs of a control transistor having a control gate electrode CG and a memory transistor having a memory gate electrode MG are connected.

Here, a MISFET including a gate insulating film (corresponding to the insulating film MZ) including a charge accumulating portion and the memory gate electrode MG is referred to as a memory transistor and a MISFET including a crate insulating film (corresponding to the gate insulating film GF) and a control gate electrode CG is called a control transistor. Since the control transistor is a memory cell selection transistor, it can also be regarded as a selection transistor.

A configuration of the memory element MC will be specifically described below.

As shown in FIG. 19, the memory element MC of the non-volatile memory includes n-type semiconductor regions MS, MD for source or drain formed in the semiconductor substrate SE (p-type well PW) a control gate electrode CG formed via the gate insulating film GF on the semiconductor substrate SE (p-type well PW), the semiconductor substrate SB (p-type well PW) and a memory gate electrode MG formed via the insulating film MZ on the (p-type well PW). The control gate electrode CG and the memory gate electrode MG are adjacent to each other having an insulating film MZ interposed therebetween.

The control gate electrode CG and the memory gate electrode MG are, in a state interposing the insulating film MZ between their opposing sides, extending along the main surface of the semiconductor substrate SB, and arranged side by side. The control gate electrode CG and the memory gate electrode MG are formed via the insulating film GF or an insulating film MZ on the semiconductor substrate SB (p-type well PW) between the semiconductor region MD and the semiconductor region MS. The memory gate electrode MG is located on the semiconductor region MS side, and the control gate electrode CG is located on the semiconductor region MD side. However, the control gate electrode CG is formed via the gate insulating film GF on the semiconductor substrate SB, and the memory gate electrode MG is formed via the insulating film MZ on the semiconductor substrate SB.

The gate insulating film GF formed between the control gate electrode CG and the semiconductor substrate SB, i.e., the gate insulating film OF under the control gate electrode CG functions as a gate insulating film of the control transistor. The insulating film GF, as described above, formed of an insulating film having the insulating film GF1 and the insulating film GF2 thereon.

In the memory element. MC, the insulating film MZ is extended over both regions of a region between the memory gate electrode MG and the semiconductor substrate SB and a region between the memory gate electrode MG and the control gate electrode CG. The insulating film MZ if formed of a stacked film having, as described above, an insulating film MZ1, an insulating film MZ2 on the insulating film MZ1, and an insulating film MZ3 on the insulating film MZ2.

The insulating film MZ between the memory gate electrode MG and the semiconductor substrate SE, i.e., the insulating film MZ under the memory gate electrode MG functions as a gate insulating film of the memory transistor. On the other hand, the insulating film MZ between the memory gate electrode MG and the control gate electrode CG functions as an insulating film for insulating (electrically isolating) between the memory gate electrode MG and the control gate electrode CG. The memory gate electrode MG is formed in a sidewall spacer shape via an insulating film MZ on one side surface of the control gate electrode CG.

The insulating film MZ2 is a trapping insulating film formed in the insulating film MZ, and it can function as a charge accumulation layer for accumulating charges (charge accumulating portion). Therefore, the insulating film MZ can be regarded as an insulating film having a charge accumulating portion therein (here, insulating film MZ2). Here, the trapping insulating film refers to an insulating film capable of accumulating charges.

Among the insulating film MZ, the insulating film MZ3 and the insulating film MZ1 can function as a charge-block layer (here, the insulating film MZ2) for confining charges in the trapping insulating film. By using a structure in which the insulating film MZ2 which is a trapping insulating film is sandwiched between the insulating films MZ1, MZ3 which function as a charge blocking layer, accumulation of electric charges on an insulating film MZ2 becomes possible. Each band gap of the insulating film MZ1 and the insulating film MZ3 is larger than a band gap of the insulating film MZ2 which is a trapping insulating film. When the insulating films MZ1, MZ3 are composed of silicon oxide and the insulating film MZ2 is composed of silicon nitride, the insulating film MZ2 can function properly as a trapping insulating film and the insulating films MZ1, MZ3 can function properly as a charge-block layer, respectively.

Each of the semiconductor region MS and the semiconductor region MD is a semiconductor region for source or drain. That is, the semiconductor region MS is a semiconductor region that functions as one of a source region or a drain region, the semiconductor region MD is a semiconductor region that functions as the other of the source region or the drain region. Here, the semiconductor region MS is a semiconductor region which functions as a source region, the semiconductor region MD is a semiconductor region which functions as a drain region. The semiconductor regions MS, MD are composed of a semiconductor region in which an n-type impurity is introduced, and each has an LDD structure. That is, the semiconductor region MD for the drain has an n--type semiconductor region EX1 (extension region) and an n+-type semiconductor region SD1 having a higher n--type semiconductor region EX1. Further, an n--type region MS for the source has an n--type semiconductor region EX2 (extension region) and an n+-type semiconductor region SD2 having a higher charge level than the n--type semiconductor region EX2.

On the side surfaces of the memory gate electrode MG and the control gate electrode CG not adjacent to each other, the sides all spacer SW is formed.

The low-density n--type semiconductor region EX1 is formed below the sidewall spacer SW on the side of the control gate electrode CG so as to be adjacent to the channel region of the control transistor, and the high-density n+-type semiconductor region SD1 is formed to be adjacent to the low-density n+-type semiconductor region EX1 and separated just by the n--type semiconductor region EX1 from the channel region of the control transistor. The low-density n--type semiconductor region EX2 is formed so as to be adjacent to the channel region of the memory transistor below the sidewall spacer SW on the side of the memory gate element MG, and the n+-type semiconductor region SD2 is formed to be adjacent to the low-density n+-type semiconductor region EX2 and separated just by the n--type semiconductor region EX2 from the channel region of the memory transistor. In the semiconductor substrate SB, the channel region of the memory transistor is formed under the insulating film MZ under the memory gate electrode MG, and a channel region of the control transistor is formed under the gate insulating film CF under the control gate electrode CG.

In the semiconductor substrate SE, under the insulating film MZ under the memory gate electrode MG, the semiconductor region CM for threshold adjustment of the memory transistor is formed. The semiconductor region CM is located under the stacked structure of the memory gate electrode MG and the insulating film MZ and is formed so as to be in contact with the insulating film MZ. Since the channel region of the memory transistor is formed in the semiconductor region CM, the semiconductor region CM located under the stacked structure of die memory gate electrode MC and the insulating film MZ can also be regarded as the channel forming region of the memory transistor.

Further, in the semiconductor substrate SB, under the gate insulating film CF under the control gate electrode CG, the semiconductor region CC for threshold adjustment of the control transistor is formed. The semiconductor region CC is located under the stacked structure of the control gate electrode CG and the gate insulating film CF is formed so as to be in contact with the gate insulating film GF. The channel region of the control transistor, since it is formed in the semiconductor region CC, the semiconductor region CC located under the stacked structure of the control gate electrode CG and the gate insulating film GF can also be regarded as the channel formation region of the control transistor.

<Operation of Memory Element>

Next, an operation example of the non-volatile memory element. MC will be described.

As a writing method, a system in which writing is performed by hot electron injection by source-side injection called the so-called SSI (source side injection) system can be used. During the writing operation, electrons are injected into the insulating film MZ2 in die insulating film MZ of the memory element by applying a predetermined writing voltage to each portion of the memory element to be written. The injected electrons are trapped in the rapped level of the insulating film MZ2 in the insulating film MZ, resulting in a rise in the threshold voltage of the memory transistor, the memory transistor becomes a write state.

As an erasing method, it is possible to use a method of performing erasing by hot hole implantation by BTBT (band-to-band tunneling) called so-called BTBT method. Further, it is also possible to use a method of performing erasure by FN (Fowler Nordheim) tunneling called so-called FN method. During the erasing operation, a predetermined erasing voltage is applied to each portion of the memory element to be erased, by injecting holes in the insulating film MZ2 in the insulating film MZ of the memory element, so that erasing is performed. The injected holes are trapped in the trapped level of the insulating film MZ2 in the insulating film MZ, resulting in a decrease in the threshold voltage of the memory transistor, and the memory transistor becomes an erase state.

To read the memory element, the threshold voltage of the memory transistor is different between the write state and the erase state. By setting the voltage applied to the memory gate electrode MG during the read operation to a value between the threshold voltage of the memory transistor in the write state and the threshold voltage of the memory transistor in the erase state, the write state and the erase state can be distinguished.

<Background of the Study>

Next, background of the studies made by the inventors of the present invention will be described.

The inventors of the present invention have studied a split-gate type memory element. The split gate type memory element is constituted by a control transistor having a control gate electrode CG and a memory transistor having a memory gate electrode MG as shown in FIG. 19 described above, and the control gate electrode CG and the memory gate electrode MG are adjacent to each other via the insulating film MZ.

In order to reduce the leakage current when the memory element is turned off, it is effective to increase the threshold voltage of the transistor of the control transistor. Note that increasing the threshold voltage corresponds to increasing the absolute value of the threshold voltage. As a technique to increase the threshold voltage of the control transistor, there is a technique to increase the impurity concentration in the channel formation region of the control transistor. However, when increasing the impurity concentration of the charnel forming region, it is possible to increase the threshold voltage and to increase the junction leakage current but there is a concern that an increase in random variations in characteristics to occur. Therefore, the inventors of the present invention have studied to increase the threshold voltage of the control transistor by introducing a metal element to the gate insulator film of the control transistor. That is, in this embodiment, the gate insulating film GF of the control transistor contains a metal element. Thus, it is possible to increase the threshold voltage of the control transistor, it is possible to suppress or prevent the problems of increasing random variations in characteristics and of increasing the leakage current to occur. Further, as the gate insulating film GF of the control transistor contains a metal element, it is possible to increase the threshold voltage of the control transistor, and it is possible to lower the impurity concentration of the channel forming region of the control transistor (semiconductor region CC). Accordingly, it is possible to lower the impurity concentration of the channel forming region of the memory transistor (semiconductor region CM). Thus, it is possible to reduce the difference in impurity concentration between the channel forming region of the control transistor (semiconductor region CC) and the channel forming region of the memory transistor (semiconductor region CM). Even in this respect, it is possible to suppress the junction leakage.

However, when introducing a metal element to the gate insulator film of the control transistor, it has been found out in the study of the inventors of the present invention that, without devising the manufacturing process, there is a possibility that the following problems occur. This will be described with reference to the manufacturing process of the semiconductor device of the study example in FIGS. 20 to 22. FIGS. 20 to 22 are cross-sectional views of a main part during the manufacturing process of the semiconductor device of the study example studied by the inventors of the present invention.

Until obtaining the structure of FIG. 5 described above, even in the case of the study example is the same as the manufacturing process of the present embodiment. In the case of the study example, after obtaining the structure of FIG. 5 described above, unlike the present embodiment, the forming step of the insulating film ZF1 shown in FIG. 6 is not performed, therefore, the sidewall insulating film ZF shown in FIG. 7 is not formed. In the case of the study example, after obtaining the structure of FIG. 5 described above, without forming the sidewall insulating film ZF on the side surface of the control gate electrode CS, an insulating film MZ101 as shown in FIG. 20 is formed to the side surface of the control gate electrode CG by performing thermal oxidation treatment while the side surface of the control gate electrode CS is exposed. The insulating film MZ101 corresponds to the insulating film MZ1.

The insulating film MZ101 is formed on the semiconductor substrate SE of a portion not covered by the control gate electrode CG, on the side surface of the control gate electrode CS, and on the upper surface of the control gate electrode CG. Therefore, in the memory-element forming region, the insulating film MZ101 is formed on the main surface of the semiconductor substrate SE so as to cover the control gate electrode CG.

The insulating film MZ101 formed on the semiconductor substrate SE of a portion not covered by the control gate electrode CG is an oxide film (silicon oxide film) formed by an oxidation of the surface of the semiconductor substrate SB. Further, the insulating film MZ101 formed on the upper surface of the control gate electrode CG is an oxide film (silicon oxide film) formed by an oxidation of the upper surface of the silicon film constituting the control gate electrode CG. This point of the insulating film MZ101 goes the same to the insulating film MZ1. However, in the case of the study example, anything corresponding to the sidewall insulating film ZF is not formed, an insulating film MZ101 is formed by thermal oxidation while the side surface of the control gate electrode CG is exposed. Therefore, the insulating film MZ101 formed on the side surface of the control gate electrode CG is an oxide film (silicon oxide film) formed by an oxidation of the side surface of the silicon film constituting the control gate electrode CG, this point is different from the insulating film MZ1 of this embodiment.

After forming the insulating film MZ101, as shown in FIG. 21, an insulating film MZ102 made of silicon nitride on the insulating film MZ101 is formed, and further, an insulating film MZ103 made of silicon oxide is formed on the insulating film MZ102. The insulating film MZ102 corresponds to the insulating film MZ2, the insulating film MZ103 corresponds to the insulating film MZ3.

The subsequent steps are the same as the above-described steps of FIGS. 11 to 18 even in the case of the study example, and as a result, the structure of FIG. 22 corresponding to the above-described FIG. 18 is obtained. The main differences between the structure of FIG. 18 and the structure of FIG. 22 is that the insulating film MZ of FIG. 18 is replaced with an insulating film MZ100 which is a stacked film of the insulating film MZ101, the insulating film MZ102 and the insulating film MZ103 in FIG. 22. Thereafter, even in the case of die study example, the step of forming the insulating film IL1 and subsequent steps are performed, the illustration and description thereof will be omitted here.

In the case of the study example, as described above, after obtaining the structure of FIG. 5, without the sidewall insulating film ZF formed on the side surface of the control gate electrode CG and while the side surface of the control gate electrode CG is exposed the insulating film MZ101 is formed by thermal oxidation as shown in FIG. 20. Therefore, the thermal oxidation treatment for forming the insulating film MZ101, while the side surface of the gate insulating film OF below the control gate electrode CG (end surface) is exposed will be performed. Accordingly, in the thermal oxidation treatment, there is a possibility that the metallic elements contained in the gate insulating film OF may diffuse into the insulating film MZ101 to be formed. There is a fear that the following problems may occur like the metallic element contained in the date insulating film OF is diffused into the insulating film MZ101. That is, when the metal element is diffused in the insulating film MZ101, die insulating film MZ101 will become an easily leaking film and thus it becomes easier for the charges trapped as injected into the insulating film MZ102 that is a charge accumulation layer to leak to the control gate electrode CG or the semiconductor substrate SE through the insulating film MZ101 by writing or erasing. This reduces the performance or reliability of semiconductor device having a memory element. Further, when the metal element contained in the gate insulating film OF is diffused into the insulating film MZ101, in the vicinity of the insulating film MZ101, there is a fear that the areal density of the metal element in the gate insulating film GF is reduced correspondingly and the threshold voltage of the control transistor is varied from die target value. This reduces the performance or reliability of a semiconductor device having s memory element. Further, when the thermal oxidation treatment for forming the insulating film MZ101 is performed in a state where the side surface of the gate insulating film GF containing a metal element is exposed, there is also a possibility that the processing device for performing the thermal oxidation treatment is contaminated by the metal element. This makes it difficult to perform the process control of the thermal oxidation treatment.

Features and Effects of the Embodiment

One of the main features of the present embodiment is that the gate insulating film GF of the control transistor constituting the memory element MC contains a metal element. Thus, since it is possible to increase the threshold voltage of the control transistor, it is possible to reduce the leakage current at the time of turning off of the memory element MC. Further, since the gate insulating film GF contains a metal element, it is possible to increase the threshold voltage of the control transistor, and a high threshold voltage of the control transistor is possible to ensure even without increasing the effective impurity concentration of the channel forming region of the control transistor (semiconductor region CC). Therefore, it is possible to suppress or prevent a problem that may occur when increasing the impurity concentration of the channel forming region of the control transistor (semiconductor region CC).

Another one of the main features of the present embodiment is performing a thermal oxidation treatment for forming an insulating film MZ1 while the sidewall insulating film ZF is formed on the side surface of the control gate electrode CG. Therefore, in the present embodiment, as shown in FIG. 7, while the side surface of the control gate electrode CG (sidewall), and the side surface of the gate insulating; film OF below the control gate electrode CG (end surface) are covered with the sidewall insulating film ZF, the thermal oxidation treatment for forming the insulating film MZ1 is performed.

In other words, since the thermal oxidation treatment for forming the insulating film MZ1 is performed while the upper surface of the gate insulating film CF is covered with the control gate electrode CG, the lower surface of the gate insulating film CF is in contact with the semiconductor substrate SB, and the side surface of the gate insulating film CF is covered with the sidewall insulating film ZF, the thermal oxidation treatment for forming the insulating film MZ1 is performed in a state where the gate insulating film GF is not exposed. Therefore, in the thermal oxidation treatment for forming the insulating film MZ1, it is possible to prevent or suppress diffusing of the metal elements contained in the gate insulating film CF into the insulating film MZ1 formed. Therefore, it is possible to prevent a problem that may occur when the metallic elements contained in the gate insulating film CF are diffused into the insulating film MZ1.

More specifically, the insulating film MZ1 becomes an easily leaking film if the metal element is diffused in the insulating film MZ1 but the present embodiment can suppress or prevent the diffusion of the metal element into the insulating film MZ1 from the insulating film GF. Thus, it is possible to suppress or prevent from making the insulating film MZ1 easily leak due to the diffusion of the metal element. In this manner, it is possible to prevent from or suppress diffusion of the charges trapped by being injected into the insulating film MZ2 that is a charge storage layer by writing or erasing and the leakage of the metal element to the control gate electrode CG or the semiconductor substrate SE through the insulating film MZ1. Further, in the present embodiment, since the metal element can be suppressed or prevented from diffusing from the gate insulating film GF to the insulating film MZ1, it is possible to prevent lowering g of the areal density of the metal element in die gate insulating film OF due to the diffusion of the metal element, thereby, it is possible to prevent variations of the threshold voltage of the control transistor from the target value. Therefore, it is possible to improve the performance of the semiconductor device having a memory element. Further, it is possible to improve the reliability of die semiconductor device having a memory element. Further, since the thermal oxidation treatment for forming the insulating film MZ1 is performed in a state where the gate insulating film GF containing a metal element is not exposed, it is possible to prevent the processing device for performing the thermal oxidation treatment from being contaminated by the metal element. Thus, it is easy to perform the process control of the thermal oxidation treatment.

Second Embodiment

A manufacturing process of a semiconductor device of the second embodiment will be described with reference to FIGS. 23 to 26. FIGS. 23 to 26 are cross-sectional views of a main part during the manufacturing process of the semiconductor device according to the present embodiment.

In the case of the second embodiment, the structure of FIG. 23 corresponding to the above-described FIG. 7 is obtained in the same manner as in the steps of FIGS. 1 to 7. The structure of FIG. 23 is different from the structure of FIG. 7 in a point that the thickness of the sidewall insulating film ZF is thicker than that of FIG. 7. To increase the thickness of the sidewall insulating film ZF, when forming the insulating film ZF1 in the step of FIG. 6, it is sufficient to increase the thickness of the forming film of the insulating film ZF1. Except for the thickness of the sidewall insulating film ZF, the structure of FIG. 23 is the same as the structure of FIG. 7.

For the second embodiment, the insulating film MZ1 is formed after obtaining the structure of FIG. 7 as shown in FIG. 24 by performing a thermal oxidation treatment. The insulating film MZ1 is an oxide film silicon oxide film) formed by thermal oxidation on the semiconductor substrate SB of a portion not covered by the control gate electrode CG, on the sidewall insulating film ZF on the side surface of the control gate electrode CG, and on the upper surface of the control gate electrode CG. That is, when the semiconductor substrate SB is oxidized, an insulating film MZ1 is formed on the semiconductor substrate SB, when a portion of the sidewall insulating film ZF is oxidized, an insulating film MZ1 is formed on the sidewall insulating film ZF, and the upper surface of the control gate electrode CG insulating film MZ1 is formed when the control gate electrode CG is oxidized. Therefore, in the memory-element forming region, the insulating film MZ1 is formed on the main surface of the semiconductor substrate SB so as to cover the control gate electrode CG. The insulating film MZ1 is formed by the same method as the First Embodiment in Embodiment Mode 2, and ISSG oxide is preferably used.

The insulating film MZ1 formed on the semiconductor substrate SB of a portion not covered by the control gate electrode CG is an oxide film (silicon oxide film) formed by an oxidation of the surface of the semiconductor substrate SB. Further, the insulating film MZ1 formed on the upper surface of the control gate electrode CG is an oxide film (silicon oxide film) formed by an oxidation of the surface (upper surface) of the silicon film constituting the control gate electrode CG. This point of the second embodiment is also the same as the first embodiment.

However, in the case of the second embodiment, the insulating film MZ1 formed on the sidewall insulating film ZF is an oxide film (silicon oxide film) formed by an oxidation of a portion of the sidewall insulating film ZF. That is, as compared to the first embodiment, the entire thickness of the sidewall insulating ZF is oxidized by the thermal oxidation process for forming the insulating film MZ1. In the second embodiment, the oxidization by the thermal oxidation process for forming the insulating film MZ1 is not achieved in the entire thickness of the sidewall insulating film ZF, but it is a part of the thickness of the sidewall insulating film ZF.

Therefore, in the first embodiment, when the thermal oxidation process for forming the insulating film MZ1 is ended, the sidewall insulating film ZF on the side surface of the control gate electrode CG does not remain, and the insulating film MZ1 is in contact with the side surface of the control gate electrode CG. In contrast, in the case of the second embodiment, even after terminating the thermal oxidation process for forming the insulating film MZ1, the sidewall insulating film ZF on the side surface of the control gate electrode CG remains, and the insulating film MZ1 is not in contact with the side surface of the control gate electrode CG. That is, in the case of the second embodiment, even after completing the insulating film MZ1 forming step, the sidewall insulating film ZF is interposed between the side surface and the insulating film MZ1 of the control gate electrode CG, and the insulating film MZ2 forming step is performed in this state. The state in which the sidewall insulating film ZF is interposed between the side surface and the insulating film MZ1 of the control gate electrode CG can be maintained even in the manufactured semiconductor device. However, a thickness of the sidewall insulating film ZF at the step of terminating the thermal oxidation treatment for forming the insulating film MZ1 (step of FIG. 24) is thinner than a thickness of the sidewall insulating film ZF at the step of performing the thermal oxidation treatment for forming the insulating film MZ1 (step of FIG. 23). This is because a portion of the thickness of the sidewall insulating film ZF is oxidized by thermal oxidation treatment, the thickness of the sidewall insulating film ZF is reduced.

Subsequent steps of the second embodiment are also the same as the first embodiment. That is, as shown in FIG. 25, an insulating film MZ2 is formed on the insulating film MZ1, and an insulating film MZ3 is formed on the insulating film MZ2. Thus, the insulating film MZ formed of the insulating film MZ1, the insulating film MZ2 on the insulating film MZ1, and an insulating film MZ3 on the insulating film MZ2 is formed. Materials and a forming method of the insulating films MZ2, MZ3 of the second embodiment are the same as the first embodiment. Thereafter, the structure of FIG. 26 corresponding to the above-described FIG. 18 is obtained in the same manner as in the steps of FIGS. 11 to 18. Thereafter, while the forming step of the insulating film IL1 and subsequent steps are performed, the illustration and description thereof will be omitted here.

As it is understandable referring to FIG. 18 of the first embodiment and FIG. 26 of the second embodiment, the structure of the formed memory element MC is different from that of the first embodiment in the second embodiment in the following points.

That is, in the second embodiment, the insulating film MZ is interposed between the memory gate electrode MG and the semiconductor substrate SS, and the sidewall insulating film ZF and the insulating film MZ are also interposed between the memory gate electrode MG and the control gate electrode CG. The sidewall insulating film ZF is interposed between the control gate electrode CG and the insulating film MZ, and the insulating film MZ1 constituting the insulating film MZ is in contact with the sidewall insulating film F. Since other configurations of the semiconductor device of the second embodiment are substantially the same as the first embodiment, repetitive descriptions thereof are omitted here.

Also in the second embodiment of the present invention, similarly to the first embodiment, in a state where the side wall insulating film ZF is formed on the side surface of the control gate electrode CG, thermal oxidation treatment for forming an insulating film MZ1 is performed. Therefore, also in the case of the second embodiment of the present embodiment, as in FIG. 23, the side surface of the control gate electrode CG, and the side surface of the gate insulating film GF below the control gate electrode CG (end surface) is covered with the sidewall insulating film ZF, and thermal oxidation treatment for forming the insulating film MZ1 is performed in that state. That is, since the thermal oxidation treatment for forming the insulating film MZ1 is performed, the upper surface of the gate insulating film GF is covered with the control gate electrode CG, the lower surface of the gate insulating film CF is in contact with the semiconductor substrate SB, and the side surface of the gate insulating film CF is covered with the sidewall insulating film ZF, the thermal oxidation treatment for forming the insulating film MZ1 is performed in a state where the gate insulating film GF is not exposed. Therefore, in the thermal oxidation treatment for forming the insulating film MZ1, it is possible to prevent or suppress diffusion of the metal elements contained in the gate insulating film GF into the insulating film MZ1 to be formed. Therefore, the above-described problems that may occur when the metal element contained in the gate insulating film CF is diffused into the insulating film MZ1 can be prevented. Therefore, it is possible to improve the performance of the semiconductor device having a memory element. Further, it is possible to improve the reliability of the semiconductor device having a memory element. Further, it is easy to perform the process control of the thermal oxidation treatment.

Further, in the second embodiment, even after forming the insulating film MZ1, the sidewall insulating film ZF made of silicon nitride on the side surface of the control gate electrode CG remains. Since silicon nitride is an insulating material suitable for the trapping insulating film, when the sidewall insulating film ZF made of silicon nitride remains on the side de surface of the control gate electrode CG in the semiconductor device manufactured, there is a concern that adversely affects the memory element since charges are accumulated in the sidewall insulating film ZF adjacent to the control gate electrode CG. Therefore, at the timing of the step of completing the thermal oxidation treatment for forming the insulating film MZ1 (step in FIG. 24), the thickness of the sidewall insulating film ZF remaining on the side surface of the control gate electrode CG is preferably 2 nm or less. When the thickness of the sidewall insulating film ZF remaining on the side surface of the control gate electrode CG is thick, the charges trapped in the sidewall insulating film ZF are hard to escape, and when the thickness of the sidewall insulating film ZF remaining on the side surface of the control gate electrode CG is 2 nm or less, even when charges are trapped in the sidewall insulating film ZF, the charges may immediately escape to the control gate electrode CG side. Thus, it is possible to suppress the charges accumulated in the sidewall insulating film ZF. Therefore, it is possible to prevent adversely affecting the memory element due to charges accumulated in the sidewall insulating film ZF.

On the other hand, in the first embodiment, after forming the insulating film MZ1, the sidewall insulating film ZF made of silicon nitride on the side surface of the control gate electrode CG does not remain, and the side surface of the control gate electrode CG is in contact with the insulating film MZ1. The insulating film MZ1 is a film that can function as a charge-block layer for confining charges in the insulating film MZ2. Therefore, in the case of the first embodiment, there is almost no concern that charges are accumulated in the insulating film MZ1 adjacent to the control gate electrode CG, therefore, charges are accumulated in the insulating film (here, the insulating film MZ1) adjacent to the control gate electrode CG, and it is possible to eliminate the fear of adversely affecting the memory element. Therefore, from the viewpoint of more accurately preventing the charge accumulation in the insulating film adjacent to the side surface of the control gate electrode CG, it is more advantageous in the first embodiment that the sidewall insulating film ZF made of silicon nitride on the side surface of the control gate electrode CG is not left.

Further, in the above-described first and second embodiments, the insulating film MZ1 is formed by thermal oxidization, more preferably, by ISSG oxidization. Here, unlike the first and second embodiments of as described above, assume that the insulating film MZ1 is formed by the CVD method. When using the CVD method to form the insulating film MZ1, as compared with the case of using thermal oxidation, since the heating temperature of the semiconductor substrate SB is lower, the metal element contained in the gate insulating film GF is difficult to diffuse into the insulating film MZ1 when forming the insulating film MZ1. However, as compared to the case of forming the insulating film MZ1 using a CVD method, film quality of the formed insulating film MZ1 is better when forming the insulating film MZ1 using thermal oxidation, and it is more suitable for the insulating film MZ1 functioning as a charge-block layer for confining charges in the insulating film MZ2. Therefore, in the above-described first and second embodiments, thermal oxidation is preferable as a method of forming the insulating film MZ1 and more preferably, it is ISSG oxidation. However, it has been found in the studies made by the inventors of the present invention that, when using thermal oxidation to form an insulating film MZ1, since the heating temperature of the semiconductor substrate SE is high, there is a concern the metal element contained in the gate insulating film OF is diffused into the insulating film MZ1 when forming the insulating film MZ1. To cope with this, in the above-described first and second embodiments, by forming the sidewall insulating film ZF on the side surface of the control gate electrode CG prior to forming the insulating film MZ1, and the insulating film MZ1 is formed in that state by thermal oxidation, more preferably by ISSG oxidation. Thus, in the thermal oxidation treatment for forming the insulating film MZ1, it is possible to suppress or prevent the metallic elements contained in the gate insulating film OF from diffusing into the insulating film MZ1.

Further, unlike the first and second embodiments described above, assume that the sidewall insulating film ZF is not oxidized at all in the thermal oxidation treatment for forming the insulating film MZ1. In this case, the insulating film MZ1 is not formed on the sidewall insulating film ZF covering the side surface of the control gate electrode CG. Therefore, in the completed memory element, a stacked structure of the insulating film ZF and the insulating film MZ2 and the insulating film MZ3 is interposed between the memory gate electrode MG and the control gate electrode, and the insulating film MZ1 will not be interposed between the insulating film ZF and the insulating film MZ2. In this case, the side surface of the control gate electrode CG is adjacent to the insulating film ZF made of silicon nitride, and the insulating film ZF will be adjacent to the insulating film MZ2 made of silicon nitride. That is, the silicon nitride film constituted by stacking of the insulating film ZF and the insulating film MZ2, i.e., a considerably thick silicon nitride film is formed so as to contact the control gate electrode CG on the side surface of the control gate electrode CG. In this case, charges are accumulated in the thick silicon nitride film adjacent to the control gate electrode CG side surface, and there is a concern that adversely affects the memory element.

In contrast, in the first embodiment, the entire sidewall insulating film ZF is oxidized in the thermal oxidation process for forming the insulating film MZ1, and it is changed to an oxide film constituting the insulating film MZ1 (silicon oxide film). Further, in the second embodiment described above, a portion of the sidewall insulating film ZF is oxidized in the thermal oxidation treatment for forming the insulating film MZ1, and it is changed to an oxide film constituting the insulating film MZ1 (silicon oxide film). Therefore, in the completed memory element, in the case of the first embodiment, between the memory gate electrode MG and the control gate electrode, the laminated structure of the insulating film MZ1 and the insulating film MZ2 and the insulating film MZ3 will be interposed, and in the case of the second embodiment, the stacked structure of the insulating film ZF and the insulating film MZ2 and the insulating film MZ3 is interposed between the memory gate electrode MG and the control gate electrode. That is, in the above-described first and second embodiments, between the memory gate electrode MG and the control gate electrode, the insulating film MZ1 is also interposed. Therefore, in the first embodiment, since the side surface of the control gate electrode CG is in contact with the insulating film MZ1, in the completed memory element, it is possible to prevent the side surface of the control gate electrode CG from being adjacent to the silicon nitride film. In this case, it is possible to eliminate concerns that adversely affect the memory element due to charges accumulated in the silicon nitride film adjacent to the side surface of the control gate electrode CG. Further, in the case of the second embodiment, although the side surface of the control gate electrode CG is in contact with the insulating film ZF, since the insulating film ZF is in contact with the insulating film MZ1 rather than the insulating film MZ2, in the completed memory device, it is possible to suppress the thickness of the silicon nitride film adjacent to the side surface of the control gate electrode CG, in this case, charges may be accumulated in the silicon nitride film adjacent to the control gate electrode CG side surface, thereby improving or reducing the concern of adversely affecting the memory element.

In the foregoing, the invention made by the inventors of the present invention has been concretely described based on the embodiments. However, it is needless to say that the present invention is not limited to the foregoing embodiments and various modifications and alterations can be made within the scope of the present invention.

The invention claimed is:

1. A method of manufacturing a semiconductor device having a memory element of a non-volatile memory, comprising:
   (a) preparing a semiconductor substrate;
   (b) forming a first gate electrode for the memory element on the semiconductor substrate via a first insulating film containing a metal element;
   (c) after the (b), forming a sidewall insulating film on a side surface of the first gate electrode;
   (d) after the (c), forming a second gate electrode for the memory element on the semiconductor substrate via a second insulating film,
   wherein, in the (d), the second gate electrode is formed so as to be adjacent to the first gate electrode via the second insulating film,
   wherein the second insulating film is comprised of a stacked film having a third insulating film, a fourth insulating film and a fifth insulating film,
   wherein the (d) includes:
      (d1) forming the third insulating film by a thermal oxidation treatment;
      (d2) forming the fourth insulating film on the third insulating film; and
      (d3) forming the fifth insulating film on the fourth insulating film,
   wherein the fourth insulating film is an insulating film having a charge accumulation function, and
   wherein, in the (d1), the third insulating film located between the second gate electrode and the semiconductor substrate is formed as a result of an oxidation of a portion of the semiconductor substrate by the thermal oxidation treatment, and the third insulating film located between the second gate electrode and the first gate electrode is formed as a result of an oxidation of the sidewall insulating film by the thermal oxidation treatment.

2. The method of manufacturing a semiconductor device according to claim 1,
   wherein the sidewall insulating film is made of silicon nitride.

3. The method of manufacturing a semiconductor device according to claim 1,
   wherein the third insulating film formed in the (d1) is in contact with the side surface of the first gate electrode.

4. The method of manufacturing a semiconductor device according to claim 1,
   wherein, in the (c), the sidewall insulating film is formed so as to cover the side surface of the first insulating film.

5. The method of manufacturing a semiconductor device according to claim 1,
   wherein the thermal oxidation treatment in the (d1) is an ISSG oxidation process.

6. The method of manufacturing a semiconductor device according to claim 1,
   wherein the first insulating film contains hafnium, aluminum, or zirconium.

7. The method of manufacturing a semiconductor device according to claim 1,
   wherein the third insulating film is made of silicon oxide,
   wherein the fourth insulating film is made of silicon nitride, and
   wherein the fifth insulating film is made of silicon oxide.

8. The method of manufacturing a semiconductor device according to claim 1,
   wherein each band gap of the third insulating film and the fifth insulating film is larger than a band gap of the fourth insulating film.

9. The method of manufacturing a semiconductor device according to claim 1, further comprising:
   (e) after the (d), forming a semiconductor region for a source or drain of the memory element in the semiconductor substrate.

10. A method of manufacturing a semiconductor device having a memory element of a non-volatile memory, comprising:
    (a) preparing a semiconductor substrate;
    (b) forming a first gate electrode for the memory element on the semiconductor substrate via a first insulating film containing a metal element;
    (c) after the (b), forming a sidewall insulating film on a side surface of the first gate electrode; and
    (d) after the (c), forming a second gate electrode for the memory element on the semiconductor substrate via a second insulating film,
    wherein, in the (d), the second gate electrode is formed so as to be adjacent to the first gate electrode via the second insulating film, wherein the second insulating film is comprised of a stacked film having a third insulating film, a fourth insulating film and a fifth insulating, wherein the (d) includes:
(d1) forming the third insulating film by a thermal oxidation treatment;
(d2) forming the fourth insulating film on the third insulating film; and
(d3) forming the fifth insulating film on the fourth insulating film, wherein the fourth insulating film is an insulating film having a charge accumulation function, and wherein, in the (d1), the third insulating film located between the second gate electrode and the semiconductor substrate is formed as a result of an oxidation of a portion of the semiconductor substrate by the thermal oxidation treatment, and the third insulating film located between the second gate electrode and the first gate electrode is formed as a result of an oxidation of a portion of the sidewall insulating film by the thermal oxidation treatment.

11. The method of manufacturing a semiconductor device according to claim 10,
wherein the sidewall insulating film is made of silicon nitride.

12. The method of manufacturing a semiconductor device according to claim 10,
wherein the (d2) is performed in a state where the sidewall insulating film is interposed between the third insulating film and the side surface of the first gate electrode.

13. The method of manufacturing a semiconductor device according to claim 10,
wherein, in the (c), the sidewall insulating film is formed so as to cover the side surface of the first insulating film.

14. The method of manufacturing a semiconductor device according to claim 10,
wherein the thermal oxidation treatment in the (d1) is an ISSG oxidation process.

15. The method of manufacturing a semiconductor device according to claim 10,
wherein the first insulating film contains hafnium, aluminum, or zirconium.

16. The method of manufacturing a semiconductor device according to claim 10,
wherein the third insulating film is made of silicon oxide, the fourth insulating film is made of silicon nitride, the fifth insulating film is made of silicon oxide.

17. The method of manufacturing a semiconductor device according to claim 10,
wherein each band gap of the third insulating film and the fifth insulating film is larger than a band gap of the fourth insulating film.

18. The method of manufacturing a semiconductor device according to claim 10, further comprising:
(e) after the (d), forming a semiconductor region for a source or drain of the memory element in the semiconductor substrate.

* * * * *